United States Patent
Henley et al.

(10) Patent No.: US 8,241,996 B2
(45) Date of Patent: *Aug. 14, 2012

(54) SUBSTRATE STIFFNESS METHOD AND RESULTING DEVICES FOR LAYER TRANSFER PROCESS

(75) Inventors: Francois J. Henley, Aptos, CA (US); Harry Robert Kirk, Campbell, CA (US); James Andrew Sullivan, Woodside, CA (US)

(73) Assignee: Silicon Genesis Corporation, San Jose, CA (US)

( * ) Notice: Subject to any disclaimer, the term of this patent is extended or adjusted under 35 U.S.C. 154(b) by 769 days.

This patent is subject to a terminal disclaimer.

(21) Appl. No.: 11/361,855

(22) Filed: Feb. 24, 2006

(65) Prior Publication Data
US 2006/0211219 A1     Sep. 21, 2006

Related U.S. Application Data

(60) Provisional application No. 60/657,558, filed on Feb. 28, 2005, provisional application No. 60/657,262, filed on Feb. 28, 2005.

(51) Int. Cl.
*H01L 21/46* (2006.01)

(52) U.S. Cl. ........ 438/458; 438/455; 438/457; 438/459; 257/E21.568

(58) Field of Classification Search .................. 438/455, 438/457, 458, 459; 257/E21.567, E21.568
See application file for complete search history.

(56) References Cited

U.S. PATENT DOCUMENTS

| | | | |
|---|---|---|---|
| 2,981,877 A | 4/1961 | Noyce | |
| 4,363,828 A | 12/1982 | Brodsky et al. | |

(Continued)

FOREIGN PATENT DOCUMENTS
WO     WO 99/08316     2/1999

OTHER PUBLICATIONS

B.N. Mukashev et al., *Hydrogen Implantation into Silicon: Infra-Red Absorption Spectra and Electrical Properties*, Institute of High Energy Physics, Academy of Sciences of the Kazakh SSR, Alma-Ata1; 91, 509 (1985).

(Continued)

*Primary Examiner* — Jack Chen
(74) *Attorney, Agent, or Firm* — Kilpatrick Townsend and Stockton LLP

(57) ABSTRACT

A method and structures for manufacturing multi-layered substrates. The method includes providing a donor substrate, which has a first deflection characteristic. The donor substrate has a backside, a face, a cleave region, and a thickness of material defined between the cleave region and the face. The method includes bonding the face of the donor substrate to a face of the handle substrate. The method includes coupling a backing substrate to the backside of the donor substrate to form a multilayered structure. The backing substrate is adequate to cause the first deflection characteristic of the donor substrate to be reduced to a predetermined level. The predetermined level is a suitable deflection characteristic for the thickness of material to be transferred onto the face of a handle substrate. The method includes initiating a controlled cleaving process within a portion of the cleave region of the donor substrate to begin removal of the thickness of material from the donor substrate at a portion of the cleave region, while the backing substrate remains attached to the donor substrate to maintain at least the suitable deflection characteristic.

61 Claims, 23 Drawing Sheets

U.S. PATENT DOCUMENTS

| | | | |
|---|---|---|---|
| 4,585,671 | A | 4/1986 | Kitagawa et al. |
| 4,696,758 | A | 9/1987 | Ovshinsky et al. |
| 5,120,394 | A | 6/1992 | Mukai |
| 5,789,030 | A | 8/1998 | Rolfson |
| 5,877,070 | A | 3/1999 | Goesele et al. |
| 6,013,563 | A | 1/2000 | Henley et al. |
| 6,033,974 | A | 3/2000 | Henley et al. |
| 6,100,166 | A | 8/2000 | Sakaguchi et al. |
| 6,103,599 | A | 8/2000 | Henley et al. |
| 6,171,965 | B1 | 1/2001 | Kang et al. |
| 6,180,496 | B1 | 1/2001 | Farrens et al. |
| 6,287,941 | B1 | 9/2001 | Kang et al. |
| 6,455,399 | B2 | 9/2002 | Malik et al. |
| 6,534,381 | B2 | 3/2003 | Cheung et al. |
| 6,586,785 | B2 | 7/2003 | Flagan |
| 6,653,212 | B1 | 11/2003 | Yamanaka et al. |
| 6,699,531 | B1 | 3/2004 | Fukiage |
| 6,716,751 | B2 | 4/2004 | Todd |
| 6,723,606 | B2 | 4/2004 | Flagan |
| 6,771,410 | B1 | 8/2004 | Bourianoff |
| 6,804,062 | B2 | 10/2004 | Atwater |
| 6,818,529 | B2 | 11/2004 | Bachrach et al. |
| 6,821,825 | B2 | 11/2004 | Todd et al. |
| 6,858,107 | B2 | 2/2005 | Ghyselen et al. |
| 6,858,517 | B2 | 2/2005 | Martinez et al. |
| 6,875,671 | B2 | 4/2005 | Faris |
| 6,884,696 | B2 | 4/2005 | Aga et al. |
| 6,900,115 | B2 | 5/2005 | Todd |
| 6,962,858 | B2 | 11/2005 | Neyret et al. |
| 6,962,859 | B2 | 11/2005 | Todd et al. |
| 7,019,339 | B2 | 3/2006 | Atwater |
| 7,029,995 | B2 | 4/2006 | Todd et al. |
| 7,772,088 | B2 * | 8/2010 | Henley et al. ............... 438/458 |
| 2002/0168868 | A1 | 11/2002 | Todd |
| 2002/0173113 | A1 | 11/2002 | Todd |
| 2002/0190269 | A1 | 12/2002 | Atwater |
| 2002/0197831 | A1 | 12/2002 | Todd et al. |
| 2003/0082300 | A1 | 5/2003 | Todd et al. |
| 2003/0095340 | A1 | 5/2003 | Atwater |
| 2003/0111013 | A1 | 6/2003 | Oosterlaken et al. |
| 2003/0129545 | A1 | 7/2003 | Kik |
| 2003/0230629 | A1 | 12/2003 | Bourianoff |
| 2003/0230778 | A1 | 12/2003 | Park et al. |
| 2004/0214434 | A1 | 10/2004 | Atwater |
| 2005/0026400 | A1 | 2/2005 | Todd et al. |
| 2005/0026432 | A1 | 2/2005 | Atwater |
| 2005/0085049 | A1 | 4/2005 | Atwater |
| 2005/0092235 | A1 | 5/2005 | Brabant et al. |
| 2005/0142879 | A1 | 6/2005 | Atwater |
| 2005/1015352 | | 7/2005 | Maa et al. |
| 2005/0208740 | A1 | 9/2005 | Todd |
| 2005/0245049 | A1 | 11/2005 | Akatsu et al. |
| 2005/0247924 | A1 | 11/2005 | Atwater |
| 2005/0250302 | A1 | 11/2005 | Todd et al. |
| 2005/0272222 | A1 | 12/2005 | Flamand et al. |
| 2005/0275067 | A1 | 12/2005 | Atwater |
| 2006/0019464 | A1 | 1/2006 | Maa et al. |
| 2006/0021565 | A1 | 2/2006 | Zahler |
| 2006/0024435 | A1 | 2/2006 | Holunga |
| 2006/0030124 | A1 | 2/2006 | Maa et al. |
| 2006/0030131 | A1 | 2/2006 | Richardson |
| 2006/0060943 | A1 | 3/2006 | Mohamed et al. |
| 2006/0071213 | A1 | 4/2006 | Ma et al. |
| 2006/0088985 | A1 | 4/2006 | Haverkort et al. |
| 2006/0108688 | A1 | 5/2006 | Richardson |
| 2006/0112986 | A1 | 6/2006 | Atwater |

OTHER PUBLICATIONS

Agarwal, et. al., Efficient Production of Silicon-on-Insulator Films by Co-Implantation of the He+ with H+, Applied Physics, Mar. 2, 1998, Letters, vol. 72, No. 9.

Bennett et al., Complete Surface Exfoliation of 4H-SiC by H+- and Si+ Coimplantation, Applied Physics Letters, vol. 76, No. 22, May 29, 2000.

Brendel, A Novel Process for Ultrathin Monocrystalline Silicon Solar Cells on Glass, 14$^{th}$ European Photovoltaic Solar Energy Conference, Jun. 30, to Jul. 4, 1997, Barcelona, Spain.

Brendel, Crystalline Thin-film Silicon Solar Cells from Layer-Transfer Processes: A Review, Proc. 10$^{th}$ Workshop on Crystalline Silicon Solar Cell Materials and Processes, Aug. 13-16, 2000, Copper Mountain, USA, ed. By B.L. Sopori, (NREL, Golden, 2000).

DeBoer, Low Temperature Epitaxial Silicon Growth Using Electron Cyclotron Resonance Plasma Deposition, Dissertation, Iowa State University, Ames, IA 1995.

DeBoer et al., Preparation and Properties of High Quality Crystalline Silicon Films Grown by ECR Plasma Deposition, IEEE, Hawaii, Dec. 5-9, 1994.

De Moor, Technology Development for 3D Integration at IMEC "3D Architectures for Semiconductor Integration and Packaging", Tempe AZ Jun. 13-15, 2005

Deng et. al., High Efficiency and High Rate Deposited Amorphous Silicon-Based Solar Cells, Phase II, Annual Technical Progress Report, Sep. 1, 2002 to Aug. 31, 2003 NREL Subcontract No. NDY-2-30630-08.

Du et. al., Impact of Hydrogen dilution on Microstructure and Optoelectronic Properties of Silicon Films Deposited using Trisilane, J. Phys D: Appl. Phys. 38 (2005) pp. 838-842.

Duo et al., Comparison Between the Different Implantation Orders in H+ and He+ Coimplantation, Journal of Physics D: Applied Physics, 34, 477-482, 2001.

Ellis Jr., et. al., Chemical Vapor Deposition of Boron-Doped Hydrogenated Amorphous Silicon, App. Phys. Lett, 47 (2), Jul. 15, 1985, p. 135.

Feijoo et al., Prestressing of Bonded Wafers. Proceedings of the First International Symposium on Semiconductor Wafer Bonding: Science, Technology and Applications, The Electrochemical Society, vol. 92-7, New York, NY 1992.

Garrou, 3D Integration: A Status Report "3D Architectures for Semiconductor Integration and Packaging", Tempe AZ Jun. 13-15, 2005

Gösele, Semiconductor Wafer Bonding: Science Technology and Applications, Electrochemical Society Proceedings, vol. 97-36, pp. 229-248.

Gui et al., The Effect of Surface Roughness on Direct Wafer Bonding, Journal of Applied Physics vol. 85, No. 10, May 15, 1999.

Gui et al., Selective Wafer Bonding by Surface Roughness Control, Journal of the Electrochemical Society, 148 (4), G225-228, 2001.

Henttinen et al., Cold Ion-Cutting of Hydrogen Implanted Si, Nuclear Instruments and Methods in Physics Research B, 190, 761-766, 2002.

Huff et. al. Silicon Materials Science and Technology, Electrochemical Society Proceedings vol. 98-1, pp. 1385-1394.

Hurley et al., Ion Implantation of Hydrogen and Helium into Silicon Wafers for Layer Transfer in Devices, Vacuum, 78, 167-175, 2005.

Joly, New Wafer to Wafer and Chip to Wafer Device Stacking Technology Implementations "3D Architectures for Semiconductor Integration and Packaging", Tempe AZ Jun. 13-15, 2005.

Kumata et. al., Photochemical Vapor Deposition of Hydrogenated Amorphous Silicon Films from Disilane and Trisilane using a Low Pressure Mercury Lamp, Appl. Phys. Lett 48 (20) May 19, 1986, p. 1380.

Lee et al., Strained Silicon Thin-Film Transistors Fabricated on Glass, Applied Physics Letters, 86, 103504, Feb. 2005.

Morrison et. al., Deposition of Amorphous and Micro-Crystalline Silicon using a Graphite Filament in the Hot Wire Cvd Technique, J. Vac. Sci. Technol A19 (6), Nov./Dec. 2001, p. 2817.

Reber et. al., Progress in High-Temperature Silicon Epitaxy using the RTCVDI60 Processor, presented at the 19$^{th}$ European Solar Energy Conference, Jun. 7-11, 2004, Paris.

Roth et. al., Kinetics of Solid Phase Epitaxy in Thick Amorphous Si Layers formed by MeV Ion Implantation, Appl. Phys. Lett 57 (13) Sep. 24, 1990, p. 1340.

Saraswat, 3-Dimensional ICs: Motivation, Performance Analysis and Technology "3D Architectures for Semiconductor Integration and Packaging", Tempe AZ Jun. 13-15, 2005.

Sarma et al., Silicon-on-Quartz for Low Power Electronic Applications, Proceedings 1994 IEEE International SOI Conference, Oct. 1994.

Shi et al., Characterization of Low-Temperature Processed Single-Crystalline Silicon Thin-Film Transistor on Glass, IEEE Electron Device Letters, vol. 24, No. 9, Sep. 2003.

Stradins et. al., Physics of Solid-Phase Epitaxy of Hydrogenated Amorphous Silicon for Thin Film Si Photovoltaics, Materials Research Society Spring Meeting, San Francisco, 2006.

Takagi et al., Wafer-Scale Room-Temperature Bonding Between Silicon and Ceramic Wafers by Means of Argon-Beam Surface Activation, IEEE, 2001.

Tong et al., Low Temperature Si Layer Splitting, Proceedings 1997 IEEE International SOI Conference, Oct. 1997.

Venezia et al., The Role of Implantation Damage in the Production of Silicon-On-Insulator Films by Co-Implantation of He+ and H+, Proceedings of the Eighth International Symposium on Silicon Materials Science and Technology, vol. 98-1, 1998.

Voltaix Currents, Responding to Trends in Solar, Voltaix Currents, Spring Newsletter, Apr. 2005.

Walker, 3D Packaging: Density, Design and Decisions "3D Architectures for Semiconductor Integration and Packaging", Tempe AZ Jun. 13-15, 2005.

Wang et. al, 17.8% P Type Heterojunction Silicon Solar Cells by HWCVD, National Renewable Energy Laboratory, Colorado, PowerPoint Presentation, Spring 2006.

Weldon et al., On the Mechanism of the Hydrogen-Induced Exfoliation of Silicon, J. Vac. Science Tech. B, 15(4), Jul./Aug. 1997.

Weldon et al., Mechanistic Studies of Silicon Wafer Bonding and Layer Exfoliation, Proceedings of the Fourth National Symposium on Semiconductor Wafer Bonding: Science, Technology, and Applications, vol. 97-36, 1998.

Weldon et al., Mechanism of Silicon Exfoliation Induced by Hydrogen/Helium co-Implantation, Applied Physics Letter, vol. 73, No. 25, Dec. 21, 1998.

* cited by examiner

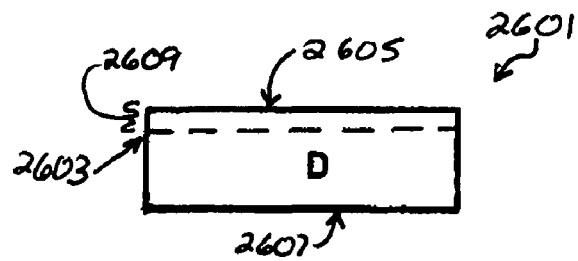
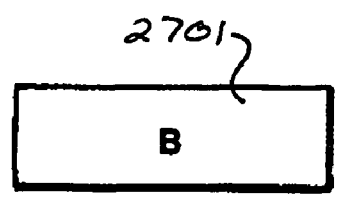
FIG. 26  FIG. 27
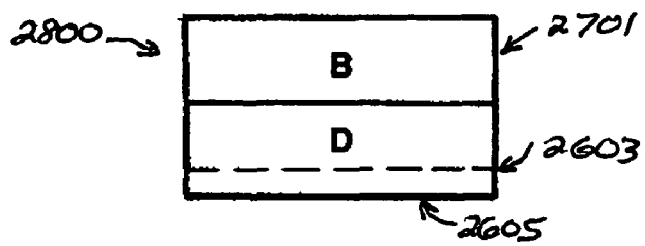
FIG. 28
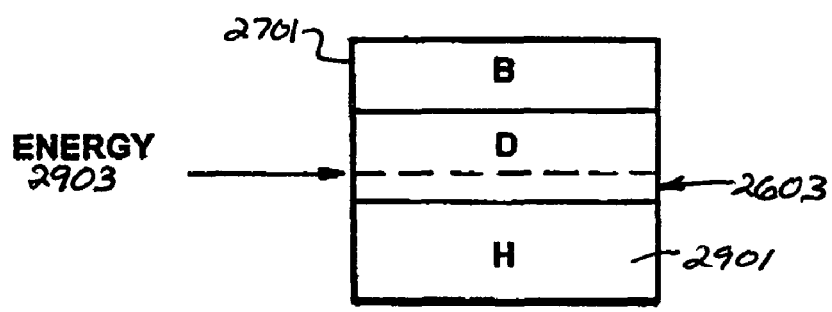
FIG. 29

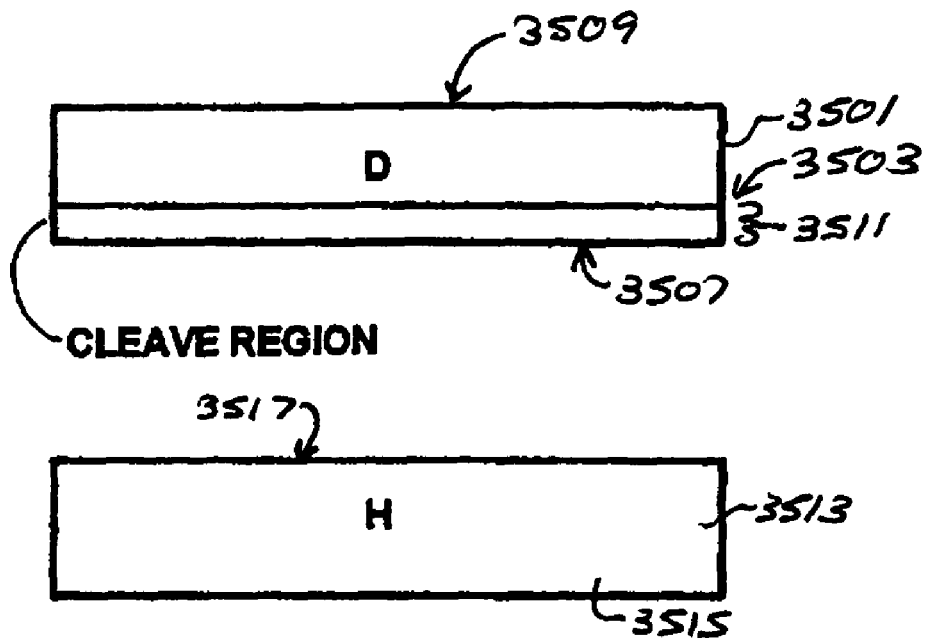
FIG. 35
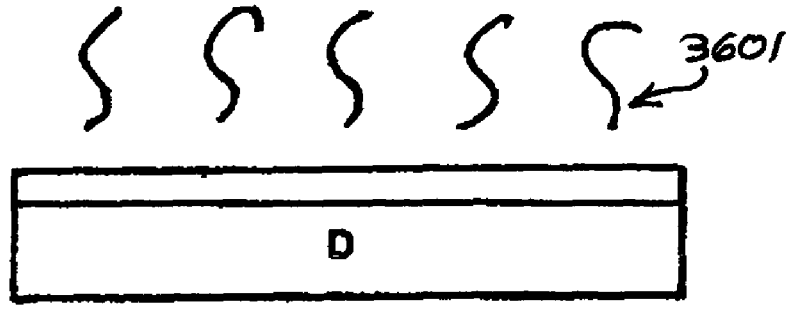
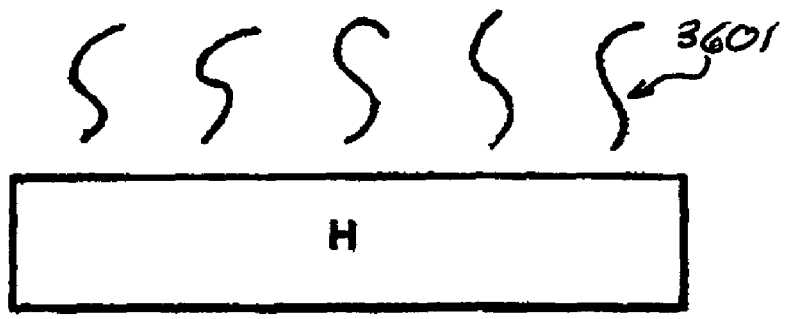
FIG. 36

SUBSTRATE STIFFNESS METHOD AND RESULTING DEVICES FOR LAYER TRANSFER PROCESS

CROSS-REFERENCES TO RELATED APPLICATIONS

The instant nonprovisional patent application claims priority to U.S. provisional patent application No. 60/657,558 filed Feb. 28, 2005, and U.S. provisional patent application No. 60/657,262 filed Feb. 28, 2005, both of which are incorporated by reference herein for all purposes.

BACKGROUND OF THE INVENTION

The present invention relates to the manufacture of substrates. More particularly, the invention provides a technique including a method and a structure for forming multi-layered substrate structures for the fabrication semiconductor integrated circuits, for example. But it will be recognized that the invention has a wider range of applicability; it can also be applied to other substrates for multi-layered integrated circuit devices, three-dimensional packaging of integrated semiconductor devices, photonic and/or optoelectronic devices, piezoelectronic devices, microelectromechanical systems ("MEMS"), nano-technology structures, sensors, actuators, solar cells, flat panel displays (e.g., LCD, AMLCD), biological and biomedical devices, and the like.

From the very early days, human beings have been building useful articles, tools, or devices using less useful materials for numerous years. In some cases, articles are assembled by way of smaller elements or building blocks. Alternatively, less useful articles are separated into smaller pieces to improve their utility. A common example of these articles to be separated include substrate structures, such as a glass plate, a diamond, a semiconductor substrate, and others.

These substrate structures are often cleaved or separated using a variety of techniques. In some cases, the substrates can be separated using a saw operation. The saw operation generally relies upon a rotating blade or tool, which cuts through the substrate material to separate the substrate material into two pieces. This technique, however, is often extremely "rough" and cannot generally be used for providing precision separations in the substrate for the manufacture of fine tools and assemblies. Additionally, the saw operation often has difficulty separating or cutting extremely hard and or brittle materials, such as diamond or glass.

Accordingly, techniques have been developed to separate these hard and or brittle materials using cleaving approaches. In diamond cutting, for example, an intense directional thermal mechanical impulse is directed preferentially along a crystallographic plane of a diamond material. This thermal mechanical impulse generally causes a cleave front to propagate along major crystallographic planes, where cleaving occurs when an energy level from the thermal mechanical impulse exceeds the fracture energy level along the chosen crystallographic plane.

In glass cutting, a scribe line using a tool is often impressed in a preferred direction on the glass material, which is generally amorphous in character. The scribe line causes a higher stress area surrounding the amorphous glass material. Mechanical force is placed on each side of the scribe line, which increases stress along the scribe line until the glass material fractures, preferably along the scribe line. This fracture completes the cleaving process of the glass, which can be used in a variety of applications, including households.

Although the techniques described above are satisfactory, for the most part, as applied to cutting diamonds or household glass, they have severe limitations in the fabrication of small complex structures or precision work pieces. For instance, the above techniques are often "rough" and cannot be used with great precision in fabrication of small and delicate machine tools, electronic devices, or the like. Additionally, the above techniques may be useful for separating one large plane of glass from another, but are often ineffective for splitting off, shaving, or stripping a thin film of material from a larger substrate. Furthermore, the above techniques may often cause more than one cleave front, which join along slightly different planes, which is highly undesirable for precision cutting applications.

Accordingly, certain techniques have been developed to cleave a thin film of crystalline material from a larger donor substrate portion. These techniques are commonly known as "layer transfer" processes. Such layer transfer processes have been useful in the manufacture of specialized substrate structures, such as silicon on insulator. As merely an example, a pioneering technique was developed by Francois J. Henley and Nathan Chung to cleave films of materials. Such technique has been described in U.S. Pat. No. 6,013,563 titled Controlled Cleaving Process, commonly assigned to Silicon Genesis Corporation of San Jose, Calif., and hereby incorporated by reference for all purposes. Although such technique has been successful, there is still a desire for improved ways of manufacturing multilayered structures.

From the above, it is seen that a technique for separating a thin film of material from a substrate which is cost effective and efficient is desirable.

BRIEF SUMMARY OF THE INVENTION

According to the present invention, techniques for the manufacture of substrates are provided. More particularly, the invention provides a technique including a method and a structure for forming multi-layered substrate structures for the fabrication semiconductor integrated circuits, for example. But it will be recognized that the invention has a wider range of applicability; it can also be applied to other substrates for multi-layered integrated circuit devices, three-dimensional packaging of integrated semiconductor devices, photonic and/or optoelectronic devices, piezoelectronic devices, microelectromechanical systems ("MEMS"), nano-technology structures, sensors, actuators, solar cells, flat panel displays (e.g., LCD, AMLCD), biological and biomedical devices, and the like.

In a specific embodiment, the present invention provides a method for manufacturing multi-layered substrates, e.g., silicon on glass, silicon on quartz. The method includes providing a handle substrate, which has a first deflection characteristic. The handle substrate also has a backside and a face. The method includes coupling a backing substrate to the backside of the handle substrate to form a multilayered structure. In a preferred embodiment, the backing substrate is adequate to cause the first deflection characteristic of the handle substrate to be reduced to a predetermined level. The predetermined level is a suitable deflection characteristic for a thickness of material to be transferred onto the face of the handle substrate. The method includes providing a donor substrate comprising a cleave region, the thickness of material, and a surface region. In a preferred embodiment, the cleave region is within the donor substrate to define the thickness of material, which is provided between the cleave region and the surface region. The method includes bonding the surface region of the donor substrate to the face of the handle substrate, while the backing substrate remains intact with the handle substrate to maintain at least the deflection characteristic. The method initiates a controlled cleaving process within a portion of the cleave region of the donor substrate to begin removal of the thickness of material from the donor substrate at a portion of the cleave region.

In an alternative specific embodiment, the present invention provides an alternative method for manufacturing multi-layered substrates. The method includes providing a donor substrate, which has a first deflection characteristic. Preferably, the donor substrate has a backside, a face, a cleave region, and a thickness of material defined between the cleave region and the face. The method includes coupling a backing substrate to the backside of the donor substrate to form a multilayered structure. In a preferred embodiment, the backing substrate is adequate to cause the first deflection characteristic of the donor substrate to be reduced to a predetermined level. The predetermined level is a suitable deflection characteristic for the thickness of material to be transferred onto a face of a handle substrate while the backing substrate remains attached to the donor substrate to maintain at least the suitable deflection characteristic. The method includes bonding the face of the donor substrate to a face of the handle substrate. The method includes initiating a controlled cleaving process within a portion of the cleave region of the donor substrate to begin removal of the thickness of material from the donor substrate at a portion of the cleave region.

In yet an alternative specific embodiment, the invention provides yet another method for manufacturing multi-layered substrates. The method includes providing a donor substrate, which has a first deflection characteristic. The donor substrate has a backside, a face, a cleave region, and a thickness of material defined between the cleave region and the face. The method includes bonding the face of the donor substrate to a face of the handle substrate. The method includes coupling a backing substrate to the backside of the donor substrate to form a multilayered structure. The backing substrate is adequate to cause the first deflection characteristic of the donor substrate to be reduced to a predetermined level. The predetermined level is a suitable deflection characteristic for the thickness of material to be transferred onto the face of a handle substrate. The method includes initiating a controlled cleaving process within a portion of the cleave region of the donor substrate to begin removal of the thickness of material from the donor substrate at a portion of the cleave region, while the backing substrate remains attached to the donor substrate to maintain at least the suitable deflection characteristic.

Moreover, the present invention provides a method for manufacturing multi-layered substrates. The method includes providing a handle substrate, which has a first deflection characteristic. The handle substrate has a backside and a face. The method includes providing a donor substrate comprising a cleave region, a thickness of material, and a surface region. The cleave region is within the donor substrate to define the thickness of material, which is provided between the cleave region and the surface region. The method includes bonding the surface region of the donor substrate to the face of the handle substrate. The method includes coupling a backing substrate to the backside of the handle substrate. Preferably, the backing substrate is adequate to cause the first deflection characteristic of the handle substrate to be reduced to a predetermined level. Such predetermined level is a suitable deflection characteristic for the thickness of material to be transferred onto the face of the handle substrate while the backing substrate remains attached to the handle substrate to maintain at least the suitable deflection characteristic. The method includes initiating a controlled cleaving process within a portion of the cleave region of the donor substrate to begin removal of the thickness of material from the donor substrate at a portion of the cleave region.

Still further, the present invention provides a method for manufacturing multi-layered substrates comprising transparent materials, e.g., glass, quartz. The method includes providing a transparent handle substrate, which has a first deflection characteristic. The transparent handle substrate has a backside and a face. The method includes initiating engagement of a backing substrate to the backside of the transparent handle substrate and attaching the backing substrate to the backside of the transparent handle substrate to firmly engage the backing substrate to the transparent handle substrate to form a multilayered structure. Preferably, the backing substrate is adequate to provide an effective deflection characteristic of the multilayered structure to be suitable for a thickness of silicon bearing material to be transferred onto the face of the handle substrate. The method includes providing a donor substrate comprising a cleave region, the thickness of silicon bearing material, and a surface region. The cleave region is within the donor substrate to define the thickness of silicon bearing material, which is provided between the cleave region and the surface region. The method includes bonding the surface region of the donor substrate to the face of the transparent handle substrate, while the backing substrate remains attached to the handle substrate to substantially maintain the effective deflection characteristic. The method initiates a controlled cleaving process within a portion of the cleave region of the donor substrate to begin removal of the thickness of silicon bearing material from the donor substrate at a portion of the cleave region.

Still further, the present invention also provides a method for manufacturing multi-layered substrates comprising transparent materials according to a preferred embodiment. The method includes providing a donor substrate comprising a cleave region, a thickness of material, and a surface region. Preferably, the cleave region is within the donor substrate to define the thickness of material, which is preferably silicon bearing material being provided between the cleave region and the surface region. The method includes providing a transparent handle substrate, which has a first deflection characteristic. Preferably, the transparent handle substrate has a backside and a face. The method includes bonding the surface region of the donor substrate to the face of the transparent handle substrate. The method also includes initiating engagement of a backing substrate to the backside of the transparent handle substrate. Additionally, the method attaches the backing substrate to the backside of the transparent handle substrate to firmly engage the backing substrate to the transparent handle substrate to form a multilayered structure. Preferably, the backing substrate is adequate to provide an effective deflection characteristic for the multilayered structure to be suitable for the thickness of silicon bearing material to be transferred onto the face of the handle substrate. The method includes initiating a controlled cleaving process within a portion of the cleave region of the donor substrate to begin removal of the thickness of silicon bearing material from the donor substrate at a portion of the cleave region.

Depending upon the specific embodiment, there can be certain variations. For example, the cleaving process can be a controlled cleaving process using a propagating cleave front to selectively free a thickness of material attached to a handle substrate. Alternative techniques for cleaving can also be used. Such techniques, include, but are not limited to those called a Nanocleave™ process of Silicon Genesis Corporation of Santa Clara, Calif., a SmartCut™ process of Soitec SA of France, and an Eltran™ process of Canon Inc. of Tokyo, Japan, any like processes, and others. Additionally, the term "first" or "second" or even "third" or any other like term is not intended to unduly limit the scope of the claims herein in a specific embodiment. Furthermore, the term deflection characteristic (e.g., first deflection characteristic) can be defined by a bending parameter that is an ability for a certain material of certain thickness according to a specific embodiment. In a specific embodiment, each substrate has a deflection characteristic. In a preferred embodiment, a weaker deflection characteristic of a certain substrate, which cannot be used effectively for cleaving and unsuitable for cleaving, is modified (e.g., increased) using a backing substrate or like feature to provide a stronger effective deflection characteristic. Such stronger effective deflection characteristic allows for a thin film of material to be removed via cleaving without any substantial undesirable characteristics such as voids, breakage, rough surfaces, film detachment, etc. Depending upon the embodiment, the term "quartz" is generally understood in the glass industry. Such quartz term includes at least fused silicon glass, quartz, fused silica, and possibly others according to a specific embodiment. Depending upon the embodiment, certain additives such as impurities, dopants, and other species may be added to the quartz. In alternative embodiments, coatings may also be provided on surfaces or other regions of the quartz material. These and other features have been described throughout the present specification and more particularly below.

Numerous benefits are achieved over pre-existing techniques using the present invention. In particular, the present invention uses controlled energy and selected conditions to preferentially cleave a thin film of material from a donor substrate which includes multi-material sandwiched films. This cleaving process selectively removes the thin film of material from the donor substrate while preventing a possibility of damage to the film or a remaining portion of the donor substrate. Accordingly, the remaining donor substrate portion can be re-used repeatedly for other applications. Additionally, the present invention uses a relatively low temperature during the controlled cleaving process of the thin film to reduce temperature excursions of the separated film, donor substrate, or multi-material films according to other embodiments. This lower temperature approach allows for more material and process latitude such as, for example, cleaving and bonding of materials having substantially different thermal expansion coefficients. In other embodiments, the present invention limits energy or stress in a substrate to a value below a cleave initiation energy, which generally removes a possibility of creating random cleave initiation sites or fronts. This reduces cleave damage (e.g., pits, crystalline defects, breakage, cracks, steps, voids, excessive roughness) often caused in pre-existing techniques. Moreover, the present invention reduces damage caused by higher than necessary stress or pressure effects and nucleation sites caused by energetic particles as compared to pre-existing techniques. Preferably, the present method and structure provides a backing structure that allows for cleaving onto substrates, which cannot effectively receive transferred films. Such backing substrate provides a certain stiffness to either or both substrates, including donor and handle, to allow effective cleaving onto thin flexible substrates according to specific embodiments. In preferred embodiments, the present invention provides a method and structure that forms a thin layer of material transferred onto a flexible substrate, without any major back grinding and/or thinning operations on the flexible substrate. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIGS. 26 through 31 illustrate an alternative method for manufacturing multi-layered substrates using a backing member according to embodiments of the present invention.

FIGS. 35 through 44 illustrate a preferred method for manufacturing multi-layered substrates using a backing member according to embodiments of the present invention.

DETAILED DESCRIPTION OF THE INVENTION

According to the present invention, techniques for the manufacture of substrates are provided. More particularly, the invention provides a technique including a method and a structure for forming multi-layered substrate structures for the fabrication semiconductor integrated circuits, for example. But it will be recognized that the invention has a wider range of applicability; it can also be applied to other substrates for multi-layered integrated circuit devices, three-dimensional packaging of integrated semiconductor devices, photonic and/or optoelectronic devices, piezoelectronic devices, microelectromechanical systems ("MEMS"), nano-technology structures, sensors, actuators, solar cells, flat panel displays (e.g., LCD, AMLCD), biological and biomedical devices, and the like.

Figure 1:
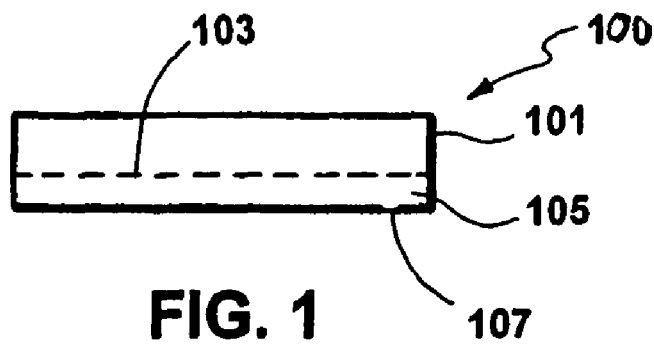
FIGS. 1 through 5 illustrate a layer transfer method for forming multi-layered substrate structures.

FIGS. 1 through 5 illustrate a layer transfer method for forming multi-layered substrate structures. As shown, we prepared certain samples of substrates that lead to breakage, and/or extreme surface roughness and discontinuous films. As merely an example, our initial substrate included silicon wafer 100, which is illustrated by FIG. 1. The silicon wafer is single crystal silicon. The single crystal silicon was SEMI standard device grade material, P-type, 6 to 9 ohm-cm. The silicon wafer had surface region 107, a cleave region 103, and thickness of material 105 between the cleave region and the surface region. The cleave plane was provided using a hydrogen implantation process. Such hydrogen implantation process was provided at a dose of 6.6E16 atoms/cm$^2$ and at an energy of about 34.5 KeV according to a certain recipe.

Figure 2:

The method also provided a transparent substrate 201, which is illustrated by FIG. 2. The transparent substrate had a thickness of about 800±20 microns, a backside surface, and a face. The transparent substrate was quartz, which was called synthetic quartz (VISIL-SQ, SX) manufactured by Shin-Etsu Chemical Co., Ltd. of Tokyo, Japan. The surface roughness of the quartz was about 2 to 3 Angstroms of a ten micron by a ten micron atomic force microscope ("AFM") measurement.

Figure 3:
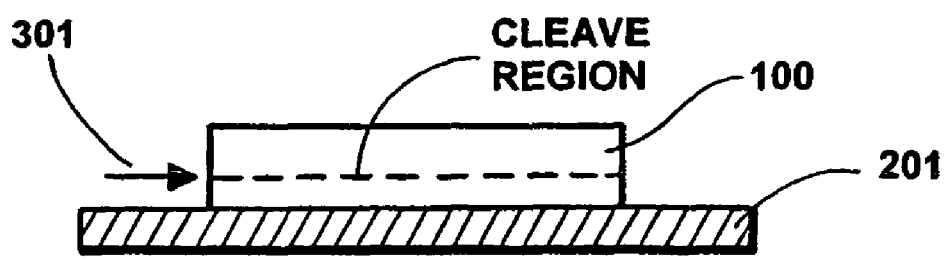

The transparent substrate and silicon wafer were both subjected to plasma activated processes. Such plasma activated processes was used to clean and/or activate the surfaces of the substrates. Thereafter, each of these substrates were bonded together, as illustrated by FIG. 3. As shown, the transparent substrate 201 has been bonded to silicon wafer 100. After bonding, the bonded structure was subjected to a bake treatment. The bake treatment maintained the bonded substrate to an anneal of about 350 Degrees Celsius for about 1 hour or so.

Figure 4:
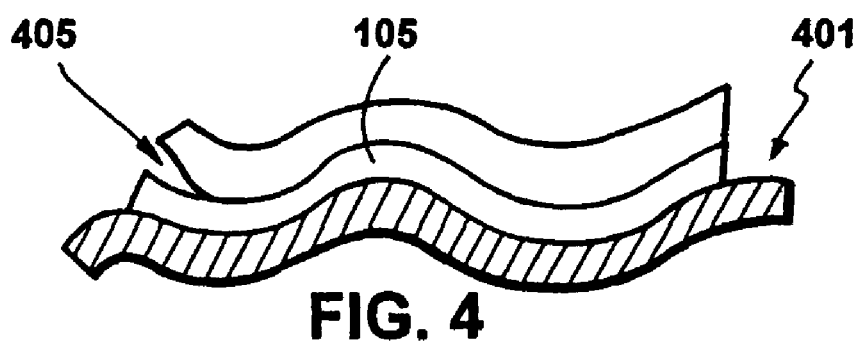
Figure 5:
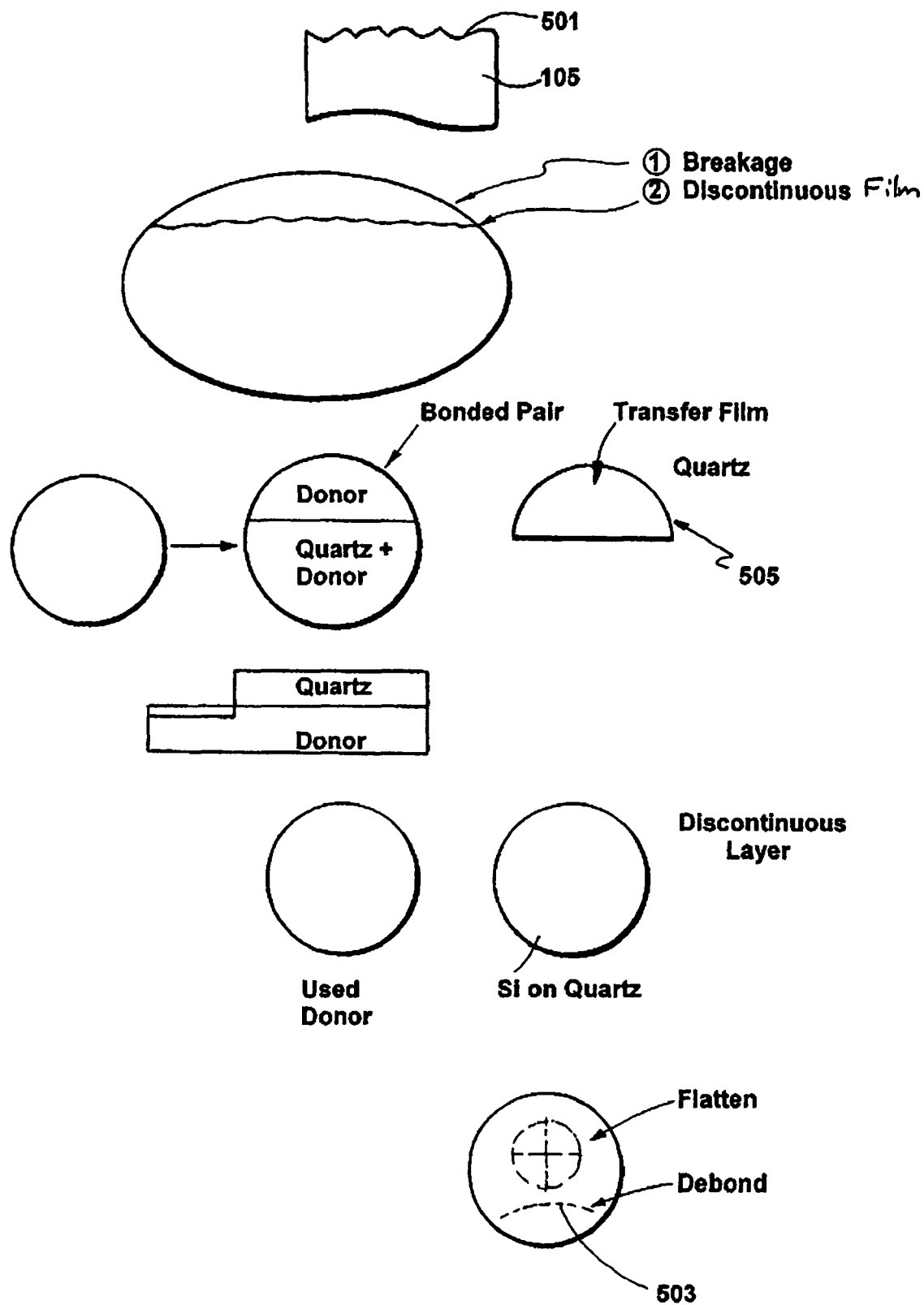

The method performed a controlled cleaving process on the bonded substrate structure, as illustrated by FIG. 3. The controlled cleaving process provided a selected energy 301 within a portion of the cleave region. As merely an example, the controlled cleaving process has been described in U.S. Pat. No. 6,013,563 titled Controlled Cleaving Process, commonly assigned to Silicon Genesis Corporation of San Jose, Calif., and hereby incorporated by reference for all purposes. Upon performing the cleaving process, we discovered the certain portions of the bonded substrate deformed and/or flexed, as illustrated by FIG. 4, upon initiation of the cleave energy provided by reference numeral 405.

The method resulted in defects such as very rough films 501, surface detachment 503, and/or film breakage 505 and other defects and imperfections. Such defects are unsuitable for the manufacture of integrated circuits or other devices. Based upon these activities, it was determined that a way to improve or at least reduce these defects among others for the manufacture of multi-layered substrate structures was needed that overcame undesirable bending characteristics. These and other limitations have been overcome using aspects of the present invention, which have been described throughout the present specification.

A method for manufacturing multi-layered substrates comprising transparent materials according to an alternative specific embodiment may be outlined as follows.

1. Provide a transparent handle substrate, which has a first deflection characteristic, a backside, and a face;

2. Provide a backing substrate that is adequate to provide an effective deflection characteristic of the multilayered structure to be suitable for a thickness of silicon bearing material to be transferred onto the face of the handle substrate;

3. Perform a cleaning and/or activating process on surfaces of the handle and backing substrates;

4. Initiate engagement of a backing substrate to the backside of the transparent handle substrate;

5. Attach the backing substrate to the backside of the transparent handle substrate to firmly engage the backing substrate to the transparent handle substrate to form a multilayered structure;

6. Provide a donor substrate comprising a cleave region, the thickness of material, and a surface region;

7. Perform a cleaning and/or activating process on surfaces of the handle and donor substrates;

8. Bond the surface region of the donor substrate to the face of the transparent handle substrate, while the backing substrate remains attached to the handle substrate to substantially maintain at least the effective deflection characteristic;

9. Initiate a controlled cleaving process within a portion of the cleave region of the donor substrate to begin removal of the thickness of silicon bearing material from the donor substrate at a portion of the cleave region;

10. Remove thickness of material from the donor substrate;

11. Optionally, remove the backing substrate from the handle substrate; and

12. Perform other steps, as desired.

The above sequence of steps provides a method according to an embodiment of the present invention. As shown, the method uses a combination of steps including a way of forming a multilayered substrate structure using a stiffening substrate on a substrate having undesirable bending characteristics. Other alternatives can also be provided where steps are added, one or more steps are removed, or one or more steps are provided in a different sequence without departing from the scope of the claims herein. Alternative embodiments of the present invention are provided throughout the present specification and more particularly below.

An alternative method for fabricating a multilayered substrate structure according to an alternative embodiment of the present invention may be outlined as follows:

1. Provide a handle substrate, which has a first deflection characteristic that is unsuitable for a layer to be effectively transferred thereon;

2. Provide a backing substrate that is adequate to cause the first deflection characteristic of the handle substrate to be reduced to a predetermined level, which is a suitable deflection characteristic for a thickness of material to be transferred onto a face of a handle substrate;

3. Perform a cleaning and/or activating process on surfaces of the handle substrate and/or backing substrate;

4. Couple the backing substrate to the backside of the handle substrate to form a multilayered structure to form a temporary bond between the backside of the handle substrate and the backing substrate;

5. Provide a donor substrate comprising a cleave region, the thickness of material, and a surface region, where the thickness of material is defined between the cleave region and the surface region;

6. Perform a cleaning and/or activating process on surfaces of the handle and donor substrate;

7. Bond the surface region of the donor substrate to the face of the handle substrate while the backing substrate remains attached with the handle substrate to maintain at least the suitable deflection characteristic;

8. Initiate a controlled cleaving process within a portion of the cleave region of the donor substrate to begin removal of the thickness of material from the donor substrate at a portion of the cleave region;

9. Completely free the thickness of material from the donor substrate coupled to handle substrate;

10. Optionally, remove the backing substrate from the handle substrate; and

11. Perform other steps, as desired.

The above sequence of steps provides a method according to an embodiment of the present invention. As shown, the method uses a combination of steps including a way of forming a multilayered substrate structure using a stiffening substrate on a substrate having undesirable bending characteristics. Other alternatives can also be provided where steps are added, one or more steps are removed, or one or more steps are provided in a different sequence without departing from the scope of the claims herein. Further details of the present method can be found throughout the present specification and more particularly below.

Figure 6:
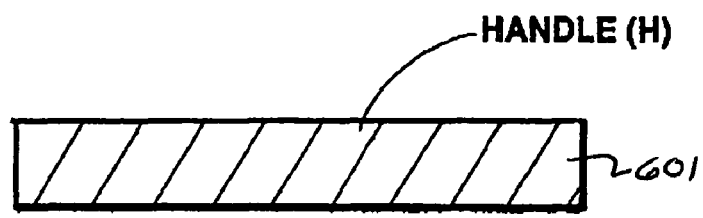
FIGS. 6 through 19 illustrate a method for manufacturing multi-layered substrates using a backing member according to embodiments of the present invention.

FIGS. 6 through 19 illustrates a method for manufacturing multi-layered substrates using a backing member according to embodiments of the present invention. These diagrams are merely examples, which should not unduly limit the scope of the claims herein. One of ordinary skill in the art would recognize many variations, modifications, and alternatives. As shown in FIG. 6, the method provides a transparent handle substrate 601, which has a first deflection characteristic, a backside, and a face. The transparent handle substrate can be glass, quartz, polymeric, or other composites, and the like. As merely an example, the transparent handle substrate can be quartz, which is called synthetic quartz (VISIL-SQ,SX) manufactured by Shin-Etsu Chemical Co., Ltd. of Tokyo, Japan. Such synthetic quartz has a thickness of about 800±20 microns, a backside surface, and a face. The surface roughness of the synthetic quartz is about 2 to 3 Angstroms surface roughness of a ten micron by a ten micron atomic force microscope ("AFM") measurement. Of course, there can be other variations, modifications, and alternatives.

In alternative embodiments, the handle substrate can be any homogeneous, graded, or multilayered material, or any combination of these. That is, the handle substrate can be made of almost any monocrystalline, polycrystalline, or even amorphous type substrate. Additionally, the substrate can be made of III/V materials such as gallium arsenide, gallium nitride (GaN), and others. Additionally, the handle substrate can be silicon carbide, germanium, silicon, glass or quartz combinations, plastics, and polymers, which have flexible characteristics. The handle substrate can comprise Si, SiGe, SiGe alloys, SiC, and Group II/VI or Group III/V compounds. Preferably, the handle substrate has a somewhat flexible characteristic that is unsuitable for a layer transfer process according to a specific embodiment. The unsuitable nature of the substrate causes excessive roughness, breakage, partial film separation, and the like depending upon the specific embodiment. Any other combinations of materials can also be used, depending upon the specific embodiment.

Figure 7:
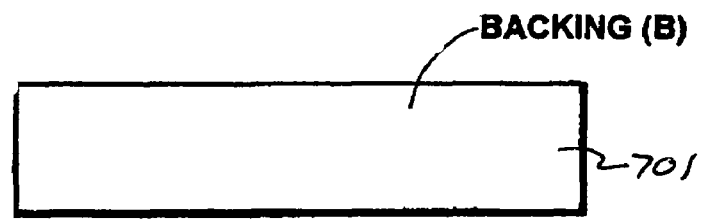

In a preferred embodiment, the present invention provides a backing substrate 701 to add rigidity to handle substrate structure, as shown in FIG. 7. Preferably, the backing substrate has a thickness and material that is adequate to provide an effective deflection characteristic of a multilayered structure composed of at least the backing substrate and handle substrates to be suitable for a thickness of silicon bearing material from a donor substrate to be transferred onto the face of the handle substrate.

As merely an example, the backing substrate is a silicon wafer for a quartz handle substrate. Such backing substrate has a thickness of 725 microns+/−15 microns and is made of single crystal silicon providing, for example, a 200 millimeter donor/handle/backing substrate structures. Such backing substrate has a Young's modulus of about 130 Giga Pascal. Other types of materials and certain thicknesses such as plastic, metal, glass, quartz, composites, and the like can be used to provide the rigidity to the combined backing and handle substrate structures. Of course, one of ordinary skill in the art would recognize other variations, modifications, and alternatives.

Figure 8:
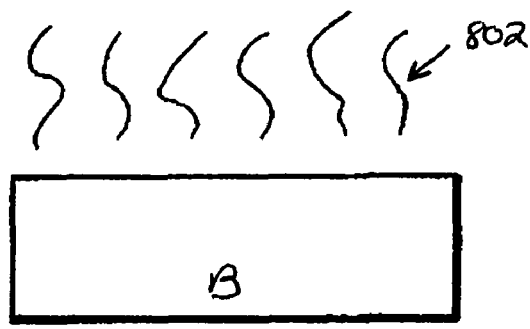
Figure 9:
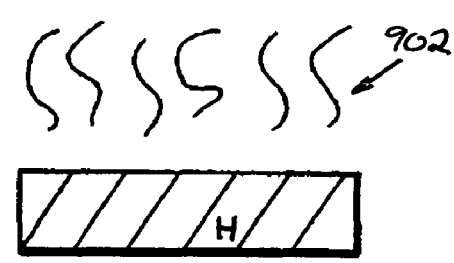

In a specific embodiment, the method performs a cleaning and/or activating process (e.g., plasma activated process) on surfaces of the backing substrate 802 and/or transparent handle substrate 902, as illustrated by FIGS. 8 and 9. Such plasma activating processes clean and/or activate the surfaces of the substrates. The plasma activated processes are provided using a nitrogen bearing plasma at 20° C.-40° C. temperature. The plasma activated processes are preferably carried out in dual frequency plasma activation system manufactured by Silicon Genesis Corporation of San Jose, Calif. Of course, there can be other variations, modifications, and alternatives.

Figure 10:
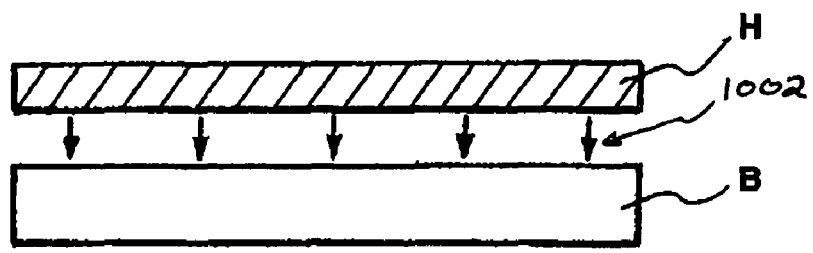
Figure 11:
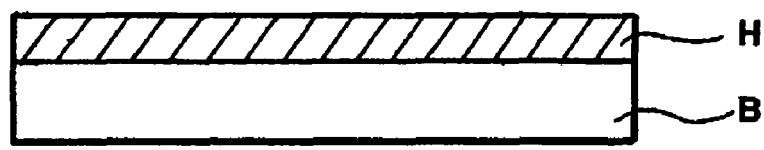

Referring to FIG. 10, the method initiates engagement 1002 of the backing substrate to the backside of the transparent handle substrate that is often physically separated from other structures. The method preferably temporarily attaches the backing substrate to the backside of the transparent handle substrate to firmly engage the backing substrate to the transparent handle substrate to form a multilayered structure. As merely an example, a silicon wafer backing substrate firmly attaches to a quartz plate without any other modifications and/or alterations according to a preferred embodiment. Here, the silicon wafer has a very thin coating of native oxide, which bonds to surfaces of the quartz plate, although there may be embodiments without such native oxide, as shown in FIG. 11.

Figure 12:
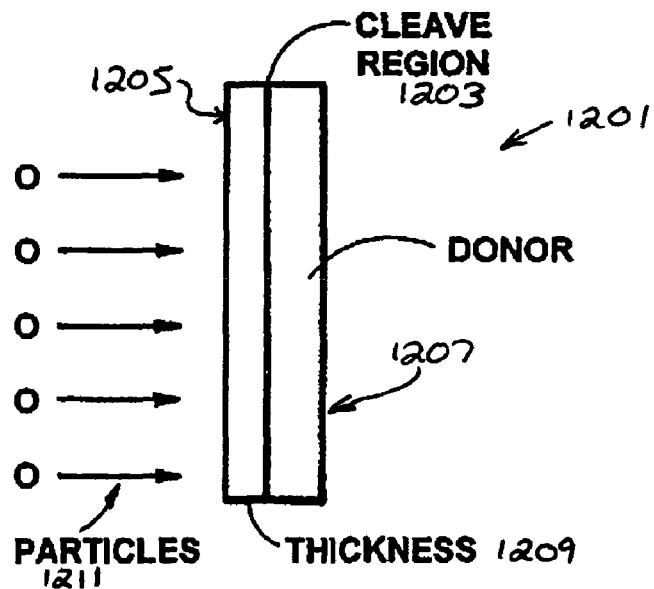
Figure 13:
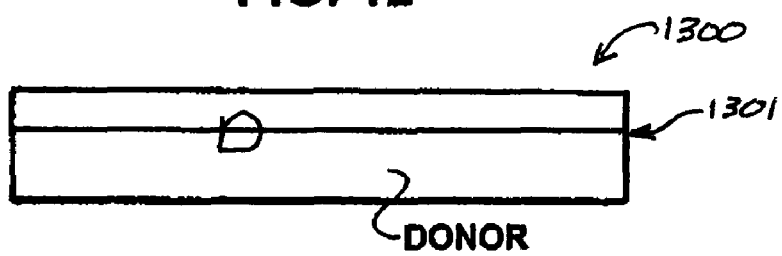

As shown, the method includes providing a donor substrate 1201 comprising a cleave region 1203, a face 1205, a backside 1207, and a thickness of silicon bearing material 1209 between the face and the cleave region, as shown in FIG. 12. As merely an example, the donor substrate can be a silicon wafer, a germanium wafer, silicon germanium materials, silicon carbide bearing materials, Group III/V compounds, any combination of these, and others. Of course there can be other variations, modifications, and alternatives.

Depending upon the embodiment, the cleave region can be formed using a variety of techniques. That is, the cleave region can be formed using any suitable combination of implanted particles, deposited layers, diffused materials, patterned regions, and other techniques. Referring to FIG. 12, the method introduces certain energetic particles 1211 using an implant process through a top surface of the donor substrate to a selected depth, which defines a thickness of the material region, termed the "thin film" of material. A variety of techniques can be used to implant the energetic particles into the silicon wafer. These techniques include ion implantation using, for example, beam line ion implantation equipment manufactured from companies such as Applied Materials, Inc. and others. Alternatively, implantation occurs using a plasma immersion ion implantation ("PIII") technique, ion shower, and other non-mass specific techniques. Combination of such techniques may also be used. Of course, techniques used depend upon the application.

Depending upon the application, smaller mass particles are generally selected to reduce a possibility of damage to the material region according to a preferred embodiment. That is, smaller mass particles easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral and or charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about $10^{15}$ to about $10^{18}$ atoms/cm$^2$, and preferably the dose is greater than about $10^{16}$ atoms/cm$^2$. Implantation energy ranges from about 1 KeV to about 1 MeV, and is generally about 50 KeV. Implantation temperature ranges from about 200 to about 600 Degrees Celsius, and is preferably less than about 400 Degrees Celsius to prevent a possibility of a substantial quantity of hydrogen ions from diffusing out of the implanted silicon wafer. The hydrogen ions can be selectively introduced into the silicon wafer to the selected depth at an accuracy of about +/−0.03 to +/−0.05 microns. Of course, the type of ion used and process conditions depend upon the application.

Effectively, the implanted particles add stress along a plane 1301 parallel to the top surface of the substrate at the selected depth. These particles reduce a fracture energy level of the substrate at the selected depth. The energies depend, in part, upon the implantation species and conditions. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can typically, at least partially, be repaired by subsequent heat treatment, e.g., thermal annealing or rapid thermal annealing. A resulting substrate 1300, which has been subject to implant, is illustrated by the simplified diagram of FIG. 13.

Depending upon the embodiment, there may be other techniques for forming a cleave region and/or cleave layer. As merely an example, such cleave region is formed using other processes, such as those called a Nanocleave™ process of Silicon Genesis Corporation of Santa Clara, Calif., a Smart-Cut™ process of Soitec SA of France, and an Eltran™ process of Canon Inc. of Tokyo, Japan, any like processes, and others. Of course, there may be other variations, modifications, and alternatives.

Figure 14:
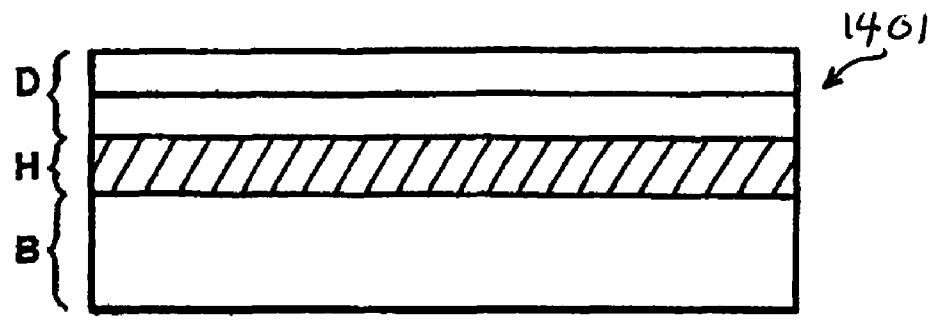

Referring to FIG. 14, the transparent handle substrate, which has been coupled to the backing, and donor substrate are both subjected to plasma activated processes. Such plasma activated processes clean and/or activate the surfaces of the substrates. The plasma activated processes are provided using a nitrogen bearing plasma at 20° C. to 40° C. temperature. The plasma activated processes are preferably carried out in dual frequency plasma activation system manufactured by Silicon Genesis Corporation of San Jose, Calif. Of course, there can be other variations, modifications, and alternatives, which have been described herein, as well as outside of the present specification.

Thereafter, each of these substrates is bonded together, as also illustrated by FIG. 14. As shown, the handle substrate is bonded to the donor substrate to form a bonded structure 1401. The substrates are preferably bonded using an EVG 850 bonding tool manufactured by Electronic Vision Group or other like processes. Other types of tools such as those manufactured by Karl Suss may also be used. Of course, there can be other variations, modifications, and alternatives. Preferably, bonding between the transparent handle substrate and the donor substrate is substantially permanent and has good reliability.

Accordingly, after bonding, the bonded structure is subjected to a bake treatment. The bake treatment maintains the bonded structure at a predetermined temperature and predetermined time. Preferably, the temperature ranges from about 200 or 250 Degrees Celsius to about 400 Degrees Celsius and is preferably about 350 Degrees Celsius for about 1 hour or so for silicon donor substrates and transparent quartz handle substrates. Depending upon the specific application, there can be other variations, modifications, and alternatives.

In a specific embodiment, the substrates are joined or fused together using a low temperature thermal step. The low temperature thermal process generally ensures that the implanted particles do not place excessive stress on the material region, which can produce an uncontrolled cleave action. In a specific embodiment, the low temperature bonding process occurs by a self-bonding process. In particular, one wafer is stripped to remove oxidation there from (or one substrate is not oxidized). A cleaning solution treats the surface of the wafer to form O—H bonds on the wafer surface. An example of a solution used to clean the wafer is a mixture of hydrogen peroxide and sulfuric acid, and other like solutions. A dryer dries the wafer surfaces to remove any residual liquids or particles from the substrate surfaces. Self-bonding occurs by placing surfaces of cleaned substrates together.

Alternatively, an adhesive is disposed on either or both surfaces of the substrates, which bond one substrate to another substrate. In a specific embodiment, the adhesive includes an epoxy, polyimide-type materials, and the like. Spin-on-glass layers can be used to bond one substrate surface onto the face of another. These spin-on-glass ("SOG") materials include, among others, siloxanes or silicates, which are often mixed with alcohol-based solvents or the like. SOG can be a desirable material because of the low temperatures (e.g., 150 to 250 degree C.) often needed to cure the SOG after it is applied to surfaces of the wafers.

Alternatively, a variety of other low temperature techniques can be used to join the donor substrate to the handle substrates. For instance, an electro-static bonding technique can be used to join the two substrates together. In particular, one or both substrate surface(s) is charged to attract to the other substrate surface. Additionally, the donor substrate can be fused to the handle substrate using a variety of other commonly known techniques. Of course, the technique used depends upon the application.

Figure 15:
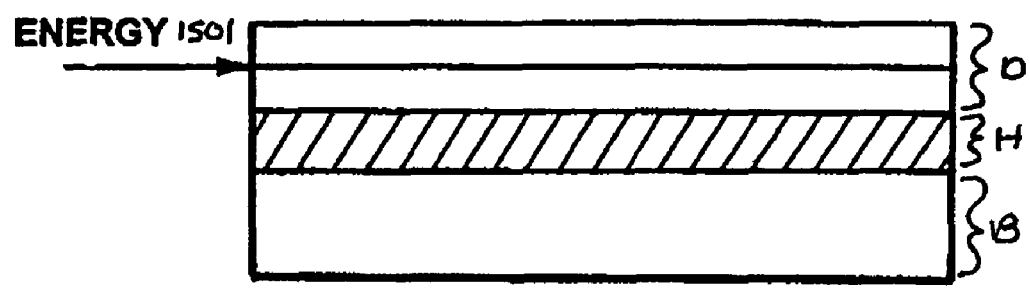
Figure 16:
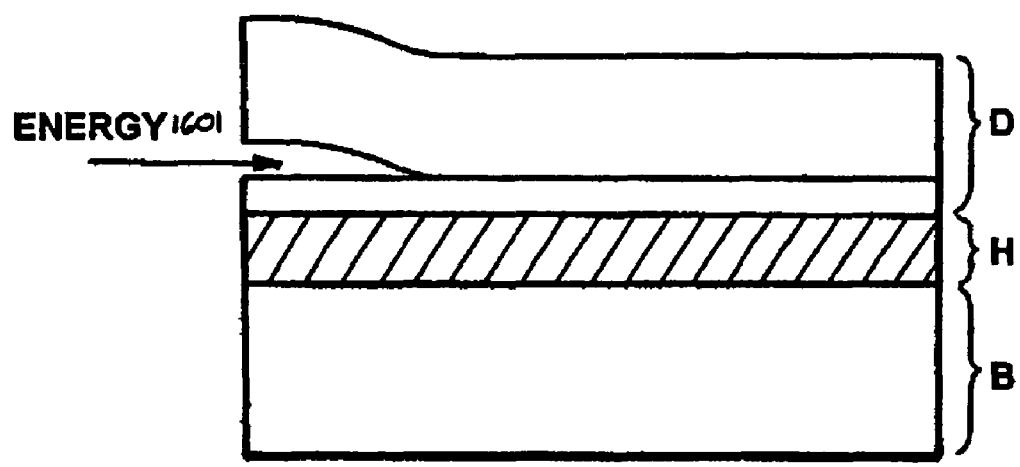
Figure 17:
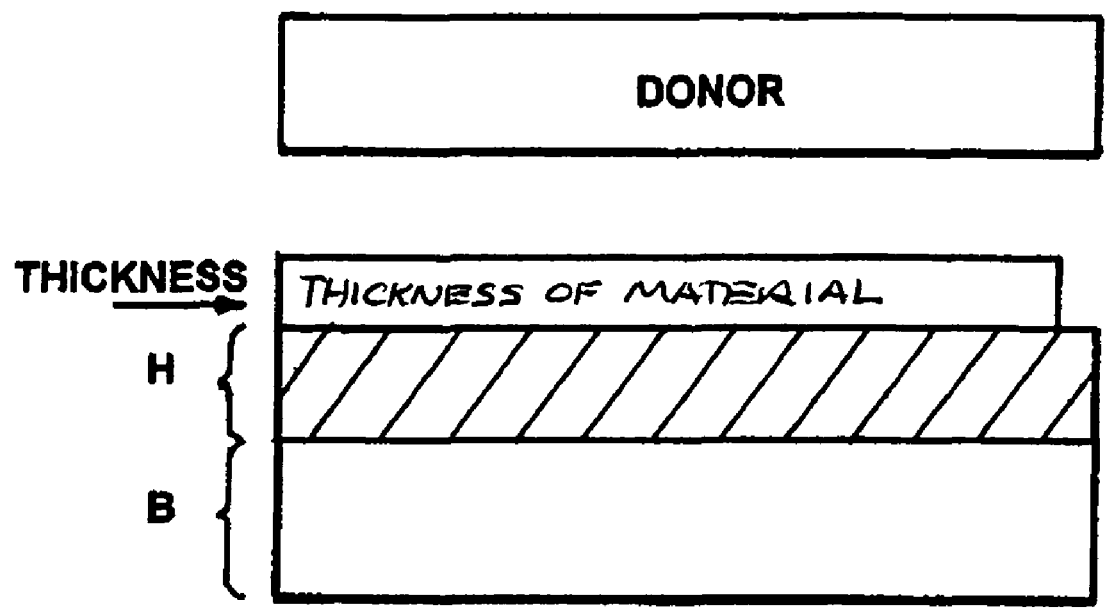

The method performs a controlled cleaving process 1601 on the bonded substrate structure, as illustrated by FIGS. 15 and 16. The controlled cleaving process provided a selected energy 1501 within a portion of the cleave region of the donor substrate. As merely an example, the controlled cleaving process has been described in U.S. Pat. No. 6,013,563 titled Controlled Cleaving Process, commonly assigned to Silicon Genesis Corporation of San Jose, Calif., and hereby incorporated by reference for all purposes. Next, the method frees the thickness of material from the donor substrate to completely remove the thickness of material from the donor substrate, as shown by FIG. 17.

Figure 18:
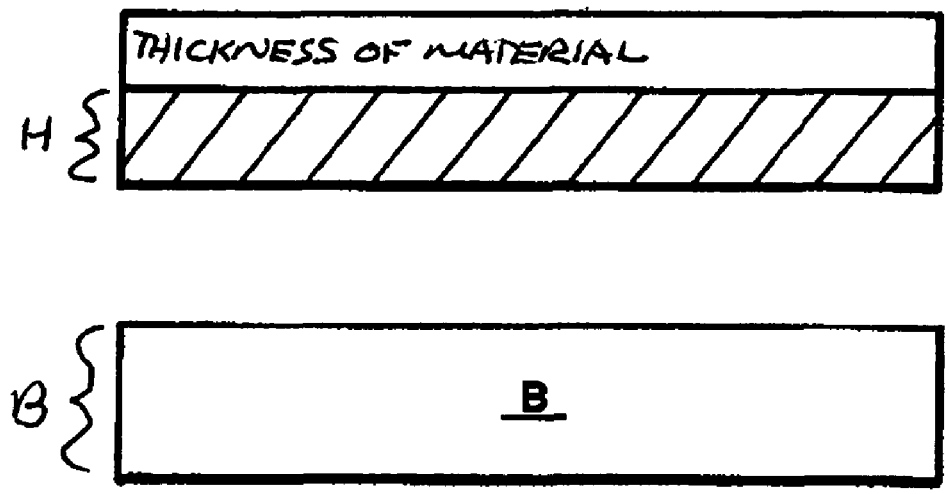

In a preferred embodiment, the method removes the backing substrate from the transparent handle substrate, as illustrated in FIG. 18. In a preferred embodiment, the attachment between the backing substrate and handle substrate is temporary and can be removed with mechanical force without damaging either substrates. In a specific embodiment, a controlled cleaving process may be used to detach the backing substrate from the handle substrate. Of course, there can be other variations, modifications, and alternatives.

Figure 19:
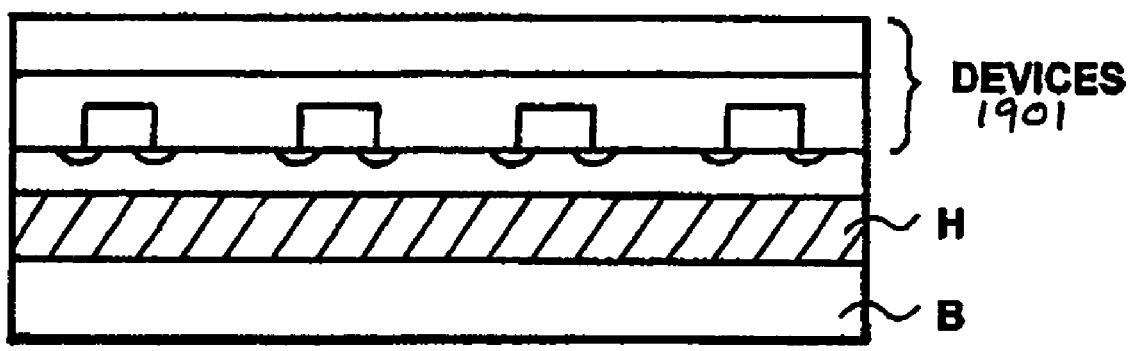

Referring to FIG. 19, the method forms devices 1901 onto surfaces of the thickness of material. Such devices can include integrated semiconductor devices, photonic and/or optoelectronic devices (e.g., light valves), piezoelectronic devices, microelectromechanical systems ("MEMS"), nanotechnology structures, sensors, actuators, solar cells, flat panel displays (e.g., LCD, AMLCD), biological and biomedical devices, and the like. Such devices can be made using deposition, etching, implantation, photo masking processes, any combination of these, and the like. Of course, there can be other variations, modifications, and alternatives. Further details of alternative embodiments of the present invention can be found throughout the present specification and more particularly below.

In an alternative specific embodiment, the present invention provides a method for fabricating a multilayered substrate structure according to an alternative embodiment of the present invention may be outlined as follows:

1. Provide a handle substrate, which has a first deflection characteristic, a backside and a face;
2. Provide a donor substrate comprising a cleave region, the thickness of material, and a surface region, the cleave region is within the donor substrate to define a thickness of material;
3. Perform a cleaning and/or activating process on surfaces of the handle and donor substrates;
4. Bond the surface region of the donor substrate to the face of the handle substrate;
5. Provide a backing substrate that is adequate to cause the first deflection characteristic of the handle substrate to be reduced to a predetermined level, which is a suitable deflection characteristic for a thickness of material to be transferred onto the face of the handle substrate while the backing substrate remains attached to the handle substrate to maintain at least the suitable deflection characteristic;
6. Perform a cleaning and/or activating process on surfaces of the handle and backing substrates;
7. Couple the backing substrate to the backside of the handle substrate;
8. Initiate a controlled cleaving process within a portion of the cleave region of the donor substrate to begin removal of the thickness of material from the donor substrate at a portion of the cleave region;
9. Optionally, remove the backing substrate from the backside of the handle substrate; and
10. Perform other steps, as desired.

The above sequence of steps provides a method according to an embodiment of the present invention. As shown, the method uses a combination of steps including a way of forming a multilayered substrate structure using a stiffening substrate on a substrate having undesirable bending characteristics. Other alternatives can also be provided where steps are added, one or more steps are removed, or one or more steps are provided in a different sequence without departing from the scope of the claims herein. Further details of the present method can be found throughout the present specification and more particularly below.

Figure 20:
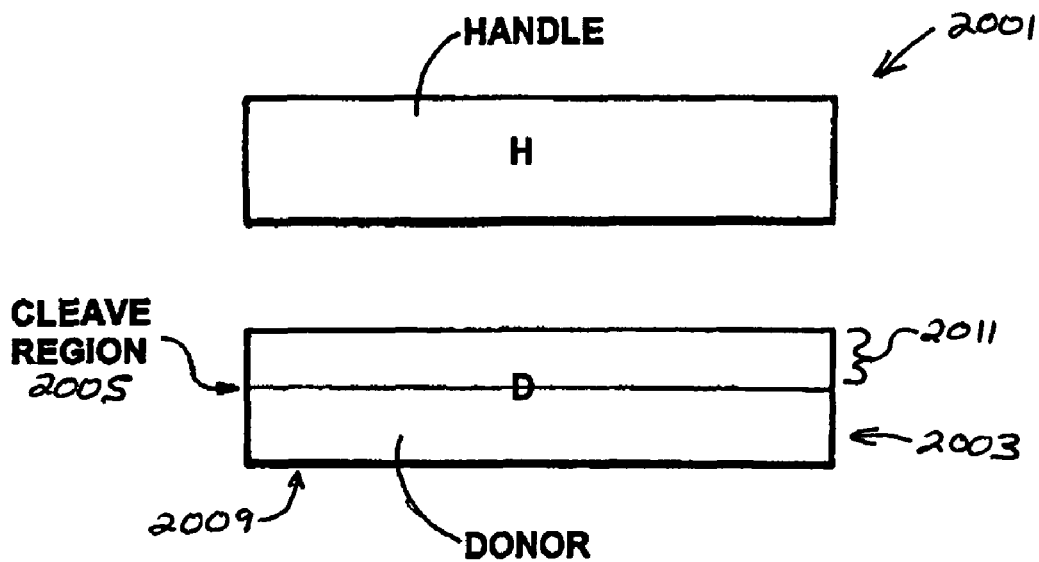
FIGS. 20 through 25 illustrate an alternative method for manufacturing multi-layered substrates using a backing member according to embodiments of the present invention.

FIGS. 20 through 25 illustrates a method for manufacturing multi-layered substrates using a backing member according to embodiments of the present invention. These diagrams are merely examples, which should not unduly limit the scope of the claims herein. One of ordinary skill in the art would recognize many variations, modifications, and alternatives. As shown in FIG. 20, the method provides a transparent handle substrate 2001, which has a first deflection characteristic, a backside, and a face. The transparent handle substrate can be glass, quartz, polymeric, or other composites, and the like. As merely an example, the transparent handle substrate can be made of quartz, which is called synthetic quartz (VI-SIL-SQ,SX) manufactured by Shin-Etsu Chemical Co., Ltd. of Tokyo, Japan. Such synthetic quartz substrate has a thickness of about 800±20 microns, a backside surface, and a face in a specific embodiment. The surface roughness of the synthetic quartz is about 2 to 3 Angstroms surface roughness of a ten micron by a ten micron atomic force microscope ("AFM") measurement. Of course, there can be other variations, modifications, and alternatives.

In alternative embodiments, the handle substrate can be any homogeneous, graded, or multilayered material, or any combination of these. That is, the handle substrate can be made of almost any monocrystalline, polycrystalline, or even amorphous type substrate. Additionally, the substrate can be made of III/V materials such as gallium arsenide, gallium nitride (GaN), and others. Additionally, the handle substrate can be silicon carbide, germanium, silicon, glass or quartz combinations, plastics, and polymers, which have flexible characteristics. The handle substrate can comprise Si, SiGe, SiGe alloys, SiC, and Group II/VI or Group III/V compounds. Preferably, the handle substrate has a somewhat flexible characteristic that is unsuitable for a layer transfer process according to a specific embodiment. The unsuitable nature of the handle substrate causes excessive roughness, breakage, partial film separation, and the like depending upon the specific embodiment. Any other combinations of materials can also be used, depending upon the specific embodiment.

As shown, the method includes providing a donor substrate 2003 comprising a cleave region 2005, a face 2007, a backside 2009, and a thickness of silicon bearing material 2011 between the face and the cleave region. As merely an example, the donor substrate can be a silicon wafer, a germanium wafer, silicon germanium materials, silicon carbide bearing materials, Group III/V compounds, any combination of these, and others. Of course there can be other variations, modifications, and alternatives.

Depending upon the embodiment, the cleave region can be formed using a variety of techniques. That is, the cleave region can be formed using any suitable combination of implanted particles, deposited layers, diffused materials, patterned regions, and other techniques. In a specific embodiment, the method introduces certain energetic particles using an implant process through a top surface of the donor substrate to a selected depth, which defines a thickness of material region, termed the "thin film" of material. A variety of techniques can be used to implant the energetic particles into the donor substrate. These techniques include ion implantation using, for example, beam line ion implantation equipment manufactured from companies such as Applied Materials, Inc. and others. Alternatively, implantation occurs using a plasma immersion ion implantation ("PIII") technique, ion shower, and other non-mass specific techniques. Combination of such techniques may also be used. Of course, techniques used depend upon the application.

Depending upon the application, smaller mass particles are generally selected to reduce a possibility of damage to the thickness of material region according to a preferred embodiment. That is, smaller mass particles easily travel through the substrate material to the selected depth without substantially damaging the thickness of material region that the particles traverse through. For example, the smaller mass particles (or energetic particles) can be almost any charged (e.g., positive or negative) and or neutral atoms or molecules, or electrons, or the like. In a specific embodiment, the particles can be neutral and or charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the top surface to the selected depth underneath the top surface.

Using hydrogen as the implanted species into a silicon wafer as an example, the implantation process is performed using a specific set of conditions. Implantation dose ranges from about $10^{15}$ to about $10^{18}$ atoms/cm$^2$, and preferably the dose is greater than about $10^{16}$ atoms/cm$^2$. Implantation energy ranges from about 1 KeV to about 1 MeV, and is generally about 50 KeV. Implantation temperature ranges from about 200 to about 600 Degrees Celsius, and is preferably less than about 400 Degrees Celsius to prevent a possibility of a substantial quantity of hydrogen ions from diffusing out of the implanted silicon wafer. The hydrogen ions can be selectively introduced into the silicon wafer to the selected depth at an accuracy of about +/−0.03 to +/−0.05 microns. Of course, the type of ion used and process conditions depend upon the application.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can typically at least partially be repaired by subsequent heat treatment, e.g., thermal annealing or rapid thermal annealing. A resulting substrate 2003, which has been subject to implant, is illustrated by the simplified diagram of FIG. 20.

Depending upon the embodiment, there may be other techniques for forming a cleave region and/or cleave layer. As merely an example, such cleave region is formed using other processes, such as those called a Nanocleave™ process of Silicon Genesis Corporation of Santa Clara, Calif., a Smart-Cut™ process of Soitec SA of France, and an Eltran™ process of Canon Inc. of Tokyo, Japan, any like processes, and others. Of course, there may be other variations, modifications, and alternatives.

In a preferred embodiment, the handle substrate, which is a detached physical entity, and donor substrate are both subjected to plasma activated processes. Such plasma activated processes clean and/or activate the surfaces of the substrates. The plasma activated processes are provided using a nitrogen bearing plasma at 20° C. to 40° C. temperature. The plasma activated processes are preferably carried out in dual frequency plasma activation system manufactured by Silicon Genesis Corporation of San Jose, Calif. Of course, there can be other variations, modifications, and alternatives, which have been described herein, as well as outside of the present specification.

Figure 21:
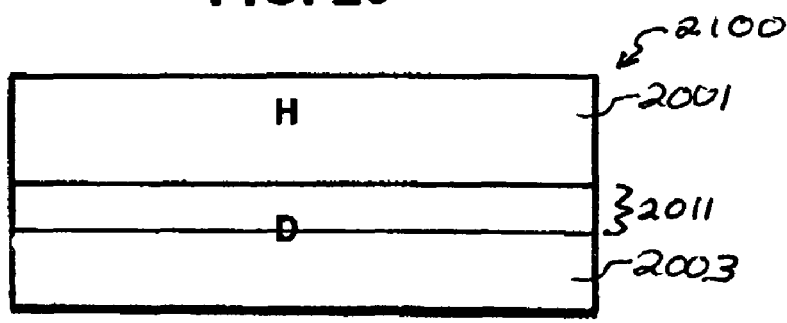

Thereafter, each of these substrates is bonded together to form a bonded substrate structure 2100, as also illustrated by FIG. 21. As shown, the handle substrate has been bonded to donor substrate. The substrates are preferably bonded using an EVG 850 bonding tool manufactured by Electronic Vision Group or other like processes. Other types of tools such as those manufactured by Karl Suss may also be used. Of course, there can be other variations, modifications, and alternatives. Preferably, bonding between the transparent handle substrate and the donor is substantially permanent and has good reliability.

Accordingly, after bonding, the bonded substrate structure is subjected to a bake treatment. The bake treatment maintains the bonded substrate structure at a predetermined temperature and predetermined time. Preferably, the temperature ranges from about 250 Degrees Celsius to about 400 Degrees Celsius and is preferably about 350 Degrees Celsius for about 1 hour or so for silicon donor substrates and transparent quartz handle substrates. Depending upon the specific application, there can be other variations, modifications, and alternatives.

In a specific embodiment, the substrates are joined or fused together using a low temperature thermal step. The low temperature thermal process generally ensures that the implanted particles do not place excessive stress on the material region, which can produce an uncontrolled cleave action. In a specific embodiment, the low temperature bonding process occurs by a self-bonding process. In particular, one wafer is stripped to remove oxidation there from (or one substrate is not oxidized). A cleaning solution treats the surface of the wafer to form O—H bonds on the wafer surface. An example of a solution used to clean the wafer is a mixture of hydrogen peroxide and sulfuric acid, and other like solutions. A dryer dries the wafer surfaces to remove any residual liquids or particles from the substrate surfaces. Self-bonding occurs by placing surfaces of cleaned substrates together.

Alternatively, an adhesive disposed on either or both surfaces of the substrates, which bond one substrate to another substrate. In a specific embodiment, the adhesive includes an epoxy, polyimide-type materials, and the like. Spin-on-glass layers can be used to bond one substrate surface onto the face of another. These spin-on-glass ("SOG") materials include, among others, siloxanes or silicates, which are often mixed with alcohol-based solvents or the like. SOG can be a desirable material because of the low temperatures (e.g., 150 to 250 degree C.) often needed to cure the SOG after it is applied to surfaces of the substrates.

Alternatively, a variety of other low temperature techniques can be used to join the donor substrate to the handle substrates. For instance, an electro-static bonding technique can be used to join the two substrates together. In particular, one or both substrate surface(s) is charged to attract to the other substrate surface. Additionally, the donor substrate can be fused to the handle substrate using a variety of other commonly known techniques. Of course, the technique used depends upon the application.

Figure 22:
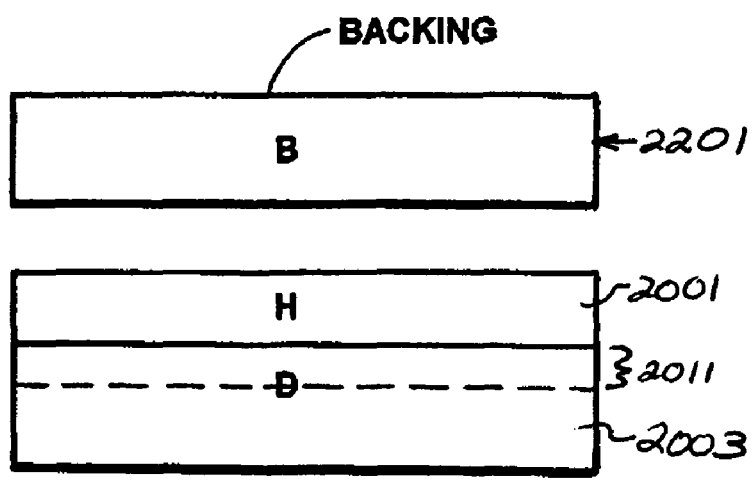

In a preferred embodiment, the present invention provides a backing substrate 2201 to add rigidity to the handle substrate, as shown in FIG. 22. Preferably, the backing substrate has a thickness and material that is adequate to provide an effective deflection characteristic of a multilayered structure composed of at least the backing substrate and handle substrates to be suitable for a thickness of silicon bearing material from the donor substrate to be transferred onto the face of the handle substrate.

As merely an example, the backing substrate is a silicon wafer for the quartz handle substrate. Such backing substrate has a thickness of 725 microns+/−15 microns and is made of single crystal silicon providing, for example, a 200 millimeter donor/handle/backing substrate structures. Such substrate has a Young's modulus of about 130 Giga Pascal. Other types of materials and certain thicknesses such as plastic, metal, glass, quartz, composites, and the like can be used to provide rigidity to the combined backing and handle substrate structures. Of course, one of ordinary skill in the art would recognize other variations, modifications, and alternatives.

In a specific embodiment, the method performs a cleaning and/or activating process (e.g., plasma activated process) on surfaces of the backing and/or transparent handle substrates. Such plasma activating processes clean and/or activate the surfaces of the substrates. The plasma activated processes are provided using a nitrogen bearing plasma at 20° C.-40° C.

temperature. The plasma activated processes are preferably carried out in dual frequency plasma activation system manufactured by Silicon Genesis Corporation of San Jose, Calif. Of course, there can be other variations, modifications, and alternatives.

Figure 23:
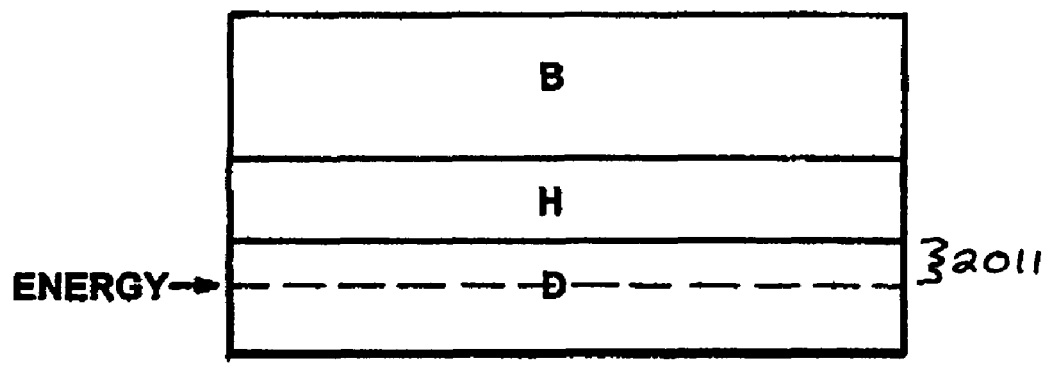

Referring to FIGS. 22 and 23, the method initiates engagement of the backing substrate to the backside of the transparent handle substrate, which has been attached to the donor substrate, according to a specific embodiment. The method preferably temporarily attaches the backing substrate to the backside of the transparent handle substrate to firmly engage the backing substrate to the transparent handle substrate to form a multilayered structure. As merely an example, a silicon wafer backing substrate firmly attaches to a quartz plate without any other modifications and/or alterations according to a preferred embodiment. Here, the silicon wafer has a very thin coating of native oxide, which bonds to surfaces of the quartz plate, although there may be embodiments without such native oxide according to a specific embodiment.

Figure 24:
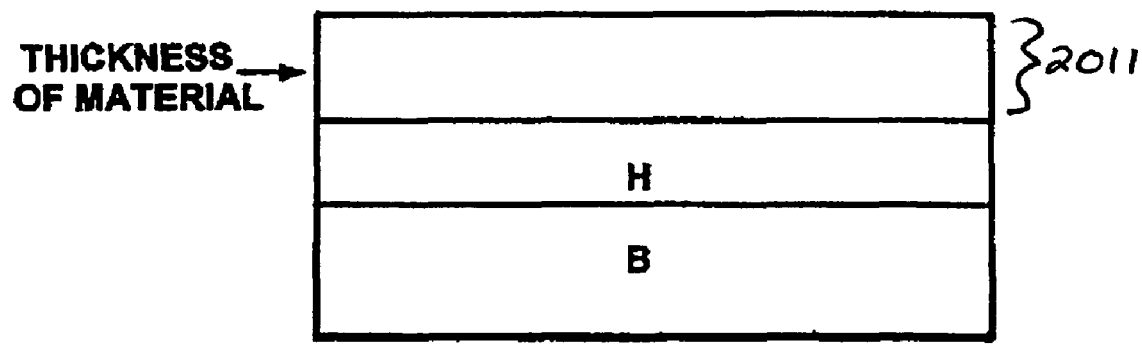

The method performs a controlled cleaving process on the bonded substrate structure, as also illustrated by FIG. 23. The controlled cleaving process provided a selected energy 2301 within a portion of the cleave region of the donor substrate. As merely an example, the controlled cleaving process has been described in U.S. Pat. No. 6,013,563 titled Controlled Cleaving Process, commonly assigned to Silicon Genesis Corporation of San Jose, Calif., and hereby incorporated by reference for all purposes. Next, the method frees the thickness of material from the donor substrate to completely remove the thickness of material from the donor substrate, as also shown by FIG. 24.

Figure 25:
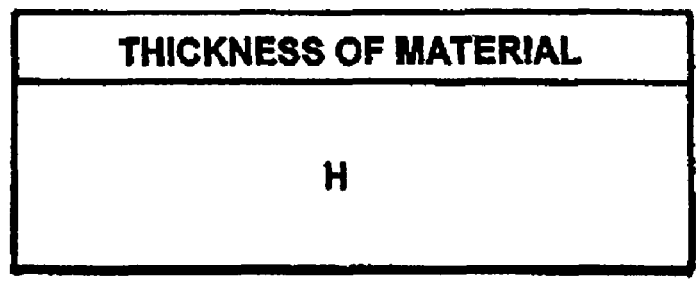

In a specific embodiment, the method removes the backing substrate from the transparent handle substrate, as illustrated in FIG. 25. In a preferred embodiment, an attachment between the backing substrate and handle substrate is temporary and can be removed with mechanical force without damaging either substrates. In a specific embodiment, a controlled cleaving process may be used to detach the backing substrate from the handle substrate. Of course, there can be other variations, modifications, and alternatives.

In a specific embodiment, the method forms devices onto surfaces of the thickness of material. Such devices can include integrated semiconductor devices, photonic and/or optoelectronic devices (e.g., light valves), piezoelectronic devices, microelectromechanical systems ("MEMS"), nanotechnology structures, sensors, actuators, solar cells, flat panel displays (e.g., LCD, AMLCD), biological and biomedical devices, and the like. Such devices can be made using deposition, etching, implantation, photo masking processes, any combination of these, and the like. Of course, there can be other variations, modifications, and alternatives. Further details of alternative embodiments of the present invention can be found throughout the present specification and more particularly below.

A method for fabricating a multilayered substrate structure according to an alternative embodiment of the present invention may be outlined as follows:

1. Provide a donor substrate, which has a first deflection characteristic, a backside, a face, a cleave region, and a thickness of material defined between the cleave region and the face;
2. Provide a backing substrate adequate to cause the first deflection characteristic of the donor substrate to be reduced to a predetermined level, which is a suitable deflection characteristic for the thickness of material to be transferred onto a face of a handle substrate while the backing substrate remains attached to the donor substrate to maintain at least the suitable deflection characteristic;
3. Perform a cleaning and/or activating process on surfaces of the backing and donor substrates;
4. Couple a backing substrate to the backside of the donor substrate to form a multilayered structure;
5. Provide a handle substrate;
6. Perform a cleaning and/or activating process on surfaces of the handle and donor substrates;
7. Bond the face of the donor substrate to a face of the handle substrate;
8. Initiate a controlled cleaving process within a portion of the cleave region of the donor substrate to begin removal of the thickness of material from the donor substrate at a portion of the cleave region;
9. Optionally, remove the backing substrate from the donor substrate; and
10. Perform other steps, as desired.

The above sequence of steps provides a method according to an embodiment of the present invention. As shown, the method uses a combination of steps including a way of forming a multilayered substrate structure using a stiffening substrate on a substrate having undesirable bending characteristics. Other alternatives can also be provided where steps are added, one or more steps are removed, or one or more steps are provided in a different sequence without departing from the scope of the claims herein. Further details of the present method can be found throughout the present specification and more particularly below.

FIGS. 26 through 31 illustrates an alternative method for manufacturing multi-layered substrates using a backing member according to embodiments of the present invention. These diagrams are merely examples, which should not unduly limit the scope of the claims herein. One of ordinary skill in the art would recognize many variations, modifications, and alternatives. As shown in FIG. 26, the method includes providing a donor substrate 2601 comprising a cleave region 2603, a face 2605, a backside 2607, and a thickness of silicon bearing material 2609 between the face and the cleave region. In a preferred embodiment, the donor substrate has a first deflection characteristic. Preferably, the donor substrate has a somewhat flexible characteristic that is unsuitable for a layer transfer process according to a specific embodiment. The unsuitable nature of the donor substrate causes excessive roughness, breakage, partial film separation, and the like depending upon the specific embodiment. As merely an example, the donor substrate can be a silicon wafer, a germanium wafer, silicon germanium materials, silicon carbide bearing materials, Group III/V compounds, any combination of these, and others. The donor substrate can comprise Si, SiGe, SiGe alloys, SiC, and Group II/VI or Group III/V compounds. Of course there can be other variations, modifications, and alternatives.

Depending upon the embodiment, the cleave region can be formed using a variety of techniques. That is, the cleave region can be formed using any suitable combination of implanted particles, deposited layers, diffused materials, patterned regions, and other techniques. In a specific embodiment, the method introduces certain energetic particles using an implant process through a top surface of the donor substrate to a selected depth, which defines a thickness of the material region, termed the "thin film" of material. A variety of techniques can be used to implant the energetic particles into the silicon wafer. These techniques include ion implantation using, for example, beam line ion implantation equipment manufactured from companies such as Applied Materials, Inc. and others. Alternatively, implantation occurs using a plasma immersion ion implantation ("PIII") technique, ion shower, and other non-mass specific techniques. Combination of such techniques may also be used. Of course, techniques used depend upon the application.

Depending upon the application, smaller mass particles are generally selected to reduce a possibility of damage to the material region according to a preferred embodiment. That is, smaller mass particles easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral and or charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the top surface to the selected depth underneath the top surface.

Using hydrogen as the implanted species into a silicon wafer as an example, the implantation process is performed using a specific set of conditions. Implantation dose ranges from about $10^{15}$ to about $10^{18}$ atoms/cm$^2$, and preferably the dose is greater than about $10^{16}$ atoms/cm$^2$. Implantation energy ranges from about 1 KeV to about 1 MeV, and is generally about 50 KeV. Implantation temperature ranges from about 200 or 250 to about 600 Degrees Celsius, and is preferably less than about 400 Degrees Celsius to prevent a possibility of a substantial quantity of hydrogen ions from diffusing out of the implanted silicon wafer. The hydrogen ions can be selectively introduced into the silicon wafer to the selected depth at an accuracy of about +/−0.03 to +/−0.05 microns. Of course, the type of ion used and process conditions depend upon the application.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can typically at least partially be repaired by subsequent heat treatment, e.g., thermal annealing or rapid thermal annealing.

Depending upon the embodiment, there may be other techniques for forming a cleave region and/or cleave layer. As merely an example, such cleave region is formed using other processes, such as those called a Nanocleave™ process of Silicon Genesis Corporation of Santa Clara, Calif., a Smart-Cut™ process of Soitec SA of France, and an Eltran™ process of Canon Inc. of Tokyo, Japan, any like processes, and others. Of course, there may be other variations, modifications, and alternatives.

In a preferred embodiment, the present invention provides a backing substrate 2701 to add rigidity to the donor substrate as shown in FIG. 27. Preferably, the backing substrate has a thickness and material that is adequate to provide an effective deflection characteristic of a multilayered structure composed of at least the backing substrate and the donor substrate to be suitable for a thickness of silicon bearing material from the donor substrate to be transferred onto the face of a handle substrate, which will be described in more detail below. As merely an example, the backing substrate can be a thicker silicon wafer as compared to the donor substrate. Such backing substrate may have a thickness of 725 microns+/−15 microns and is made of single crystal silicon providing, for example, a 200 millimeter donor/handle/backing substrate structures. Such substrate has a Young's modulus of about 130 Giga Pascal. Other types of materials and certain thicknesses such as plastic, metal, glass, quartz, composites, and the like can be used to provide rigidity to the combined backing and donor substrate structures. Of course, one of ordinary skill in the art would recognize other variations, modifications, and alternatives.

In a specific embodiment, the method performs a cleaning and/or activating process (e.g., plasma activated process) on surfaces of the backing and/or donor substrates. Such plasma activating processes clean and/or activate the surfaces of the substrates. The plasma activated processes are provided using a nitrogen bearing plasma at 20° C.-40° C. temperature. The plasma activated processes are preferably carried out in dual frequency plasma activation system manufactured by Silicon Genesis Corporation of San Jose, Calif. Of course, there can be other variations, modifications, and alternatives.

Referring to FIG. 28, the method initiates engagement of the backing substrate to the backside of the donor substrate that is often physically separated from other structures. The method preferably temporarily attaches the backing substrate to the backside of the donor substrate to firmly engage the backing substrate to the donor substrate to form a multilayered structure 2800. As merely an example, a silicon wafer backing substrate firmly attaches to a silicon wafer donor substrate without any other modifications and/or alterations according to a preferred embodiment. Here, the silicon wafer backing substrate has a very thin coating of native oxide, which bonds to surfaces of the silicon wafer donor substrate, although there may be embodiments without such native oxide.

As shown in FIG. 29, the method provides a handle substrate 2901 in a specific embodiment. The handle substrate can be silicon, glass, quartz, polymeric, or other composites, and the like. In alternative embodiments, the handle substrate can be any homogeneous, graded, or multilayered material, or any combination of these. That is, the handle substrate can be made of almost any monocrystalline, polycrystalline, or even amorphous type substrate. Additionally, the handle substrate can be made of III/V materials such as gallium arsenide, gallium nitride (GaN), and others. Additionally, the handle substrate can be silicon carbide, germanium, silicon, glass or quartz combinations, plastics, and polymers, which have flexible characteristics. The handle substrate can comprise Si, SiGe, SiGe alloys, SiC, and Group II/VI or Group III/V compounds. Any other combinations of materials can also be used, depending upon the specific embodiment.

In a specific embodiment, the handle substrate, which is free from the donor substrate, and donor substrate, which has been coupled to the backing, are both subjected to plasma activated processes. Such plasma activated processes clean and/or activate the surfaces of the substrates. The plasma activated processes are provided using a nitrogen bearing plasma at 20° C. to 40° C. temperature. The plasma activated processes are preferably carried out in dual frequency plasma activation system manufactured by Silicon Genesis Corporation of San Jose, Calif. Of course, there can be other variations, modifications, and alternatives, which have been described herein, as well as outside of the present specification.

Thereafter, each of these substrates is bonded together to form a bonded substrate structure 2900 in a specific embodiment. As shown, the handle substrate has been bonded to the donor substrate, which has already been bonded to the backing substrate. The substrates are preferably bonded using an EVG 850 bonding tool manufactured by Electronic Vision Group or other like processes. Other types of tools such as those manufactured by Karl Suss may also be used. Of course, there can be other variations, modifications, and alternatives. Preferably, bonding between the handle substrate and the donor is substantially permanent and has good reliability.

Accordingly after bonding, the bonded substrate structure is subjected to a bake treatment. The bake treatment maintains the bonded substrate structure at a predetermined temperature and predetermined time. Preferably, the temperature ranges from about 250 Degrees Celsius to about 400 Degrees Celsius and is preferably about 350 Degrees Celsius for about 1 hour or so for silicon donor and quartz handle substrates. Depending upon the specific application, there can be other variations, modifications, and alternatives.

In a specific embodiment, the substrates are joined or fused together using a low temperature bonding step. The low temperature bonding process generally ensures that the implanted particles do not place excessive stress on the material region, which can produce an uncontrolled cleave action. In a specific embodiment, the low temperature bonding process occurs by a self-bonding process. In particular, one wafer is stripped to remove oxidation there from (or one substrate is not oxidized). A cleaning solution treats the surface of the wafer to form O—H bonds on the wafer surface. An example of a solution used to clean the wafer is a mixture of hydrogen peroxide and sulfuric acid, and other like solutions. A dryer dries the substrate surfaces to remove any residual liquids or particles from the substrate surfaces. Self-bonding occurs by placing surfaces of cleaned substrates together.

Alternatively, an adhesive is disposed on either or both surfaces of the substrates, which bond one substrate to another substrate. In a specific embodiment, the adhesive includes an epoxy, polyimide-type materials, and the like. Spin-on-glass layers can be used to bond one substrate surface onto the face of another. These spin-on-glass ("SOG") materials include, among others, siloxanes or silicates, which are often mixed with alcohol-based solvents or the like. SOG can be a desirable material because of the low temperatures (e.g., 150 to 250 degree C.) often needed to cure the SOG after it is applied to surfaces of the wafers.

Alternatively, a variety of other low temperature techniques can be used to join the donor substrate to the handle substrates. For instance, an electro-static bonding technique can be used to join the two substrates together. In particular, one or both substrate surface(s) is charged to attract to the other substrate surface. Additionally, the donor substrate can be fused to the handle substrate using a variety of other commonly known techniques. Of course, the technique used depends upon the application.

The method performs a controlled cleaving process on the bonded substrate structure, as illustrated by FIG. 29. The controlled cleaving process provided a selected energy 2903 within a portion of the cleave region of the donor substrate. As merely an example, the controlled cleaving process has been described in U.S. Pat. No. 6,013,563 titled Controlled Cleaving Process, commonly assigned to Silicon Genesis Corporation of San Jose, Calif., and hereby incorporated by reference for all purposes. Next, the method frees the thickness of material 2603 from the donor substrate to completely remove the thickness of material from the donor substrate, as shown by FIG. 30.

Figure 30:
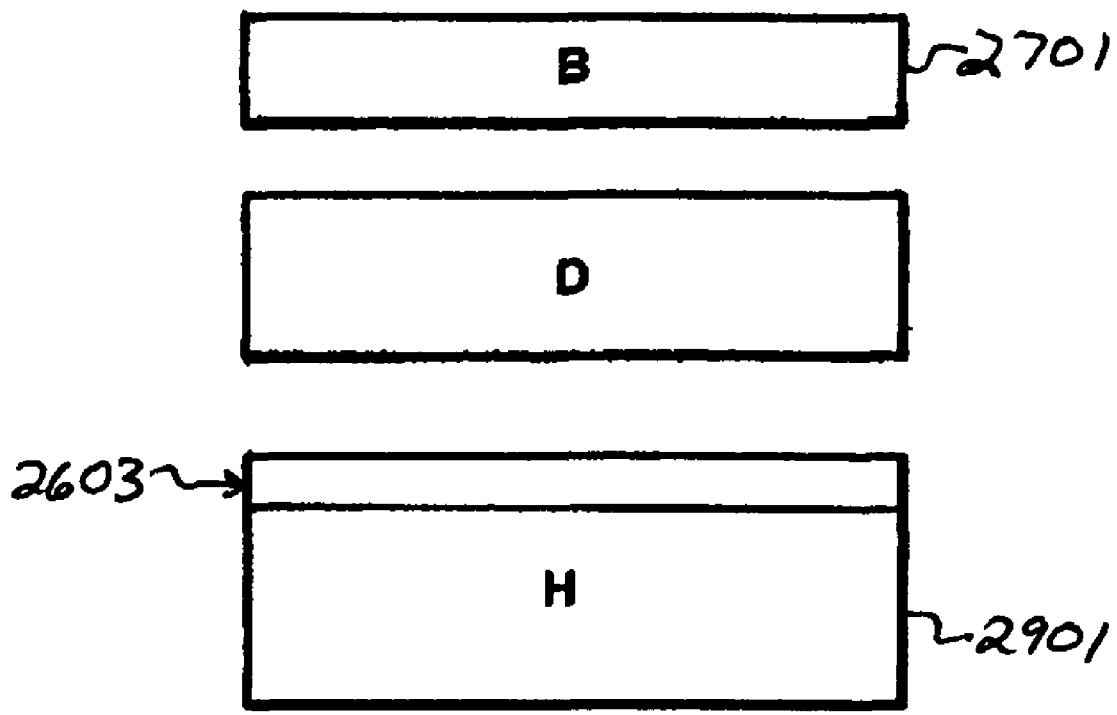
Figure 31:
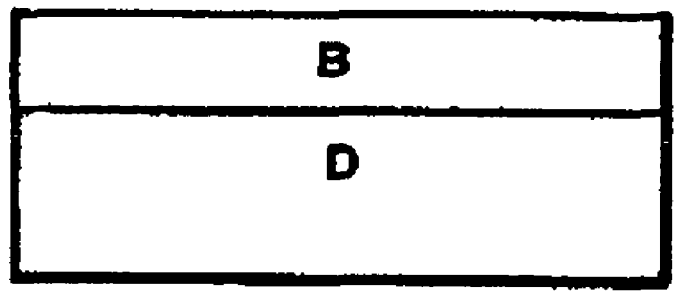

In a preferred embodiment, the method removes the backing substrate from the donor substrate, as illustrated in FIG. 30. In a specific embodiment, the attachment between the backing substrate and the donor substrate is temporary and can be removed with mechanical force without damaging either substrates. In a specific embodiment, a controlled cleaving process may be used to detach the backing substrate from the donor substrate. In a preferred embodiment, the backing substrate remains attached to the donor substrate for repeated use according to a specific embodiment, as illustrated by FIG. 31. That is, the thin donor substrate, which is unsuitable for cleaving, can be reused by way of the backing substrate according to a specific embodiment. Of course, there can be other variations, modifications, and alternatives.

In a specific embodiment, the method forms devices onto surfaces of the thickness of material. Such devices can include integrated semiconductor devices, photonic and/or optoelectronic devices (e.g., light valves), piezoelectronic devices, microelectromechanical systems ("MEMS"), nano-technology structures, sensors, actuators, solar cells, flat panel displays (e.g., LCD, AMLCD), biological and biomedical devices, and the like. Such devices can be made using deposition, etching, implantation, photo masking processes, any combination of these, and the like. Of course, there can be other variations, modifications, and alternatives. Further details of alternative embodiments of the present invention can be found throughout the present specification and more particularly below.

In yet an alternative specific embodiment, the present invention provides a method for fabricating a multilayered substrate structure according to an alternative embodiment of the present invention may be outlined as follows:

1. Provide a donor substrate, which has a first deflection characteristic, a backside, a face, a cleave region, and a thickness of material defined between the cleave region and the face;
2. Provide a handle substrate;
3. Perform a cleaning and/or activating process on surfaces of the handle and donor substrates;
4. Bond the face of the donor substrate to a face of the handle substrate;
5. Provide a backing substrate that is adequate to cause the first deflection characteristic of the donor substrate to be reduced to a predetermined level, which is a suitable deflection characteristic for the thickness of material to be transferred onto the face of a handle substrate;
6. Perform a cleaning and/or activating process on surfaces of the backing and donor substrates;
7. Coupling a backing substrate to the backside of the donor substrate coupled to the handle substrate to form a multilayered structure,
8. Initiate a controlled cleaving process within a portion of the cleave region of the donor substrate to begin removal of the thickness of material from the donor substrate at a portion of the cleave region while the backing substrate remains attached to the donor substrate to maintain at least the suitable deflection characteristic;
9. Optionally, remove the backing substrate from the donor substrate; and
10. Perform other steps, as desired.

The above sequence of steps provides a method according to an embodiment of the present invention. As shown, the method uses a combination of steps including a way of forming a multilayered substrate structure using a stiffening substrate on a substrate having undesirable bending characteristics. Other alternatives can also be provided where steps are added, one or more steps are removed, or one or more steps are provided in a different sequence without departing from the scope of the claims herein. Further details of the present method can be found throughout the present specification and more particularly below.

Figure 32:
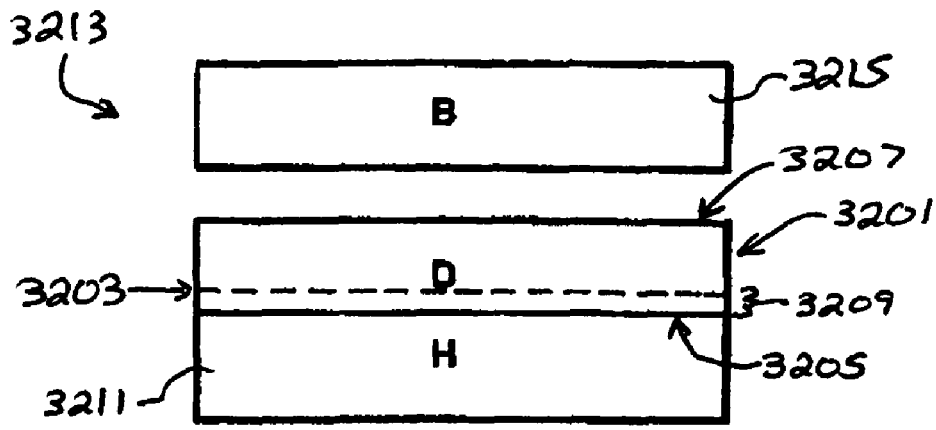
FIGS. 32 through 34 illustrate an alternative method for manufacturing multi-layered substrates using a backing member according to embodiments of the present invention.
Figure 33:
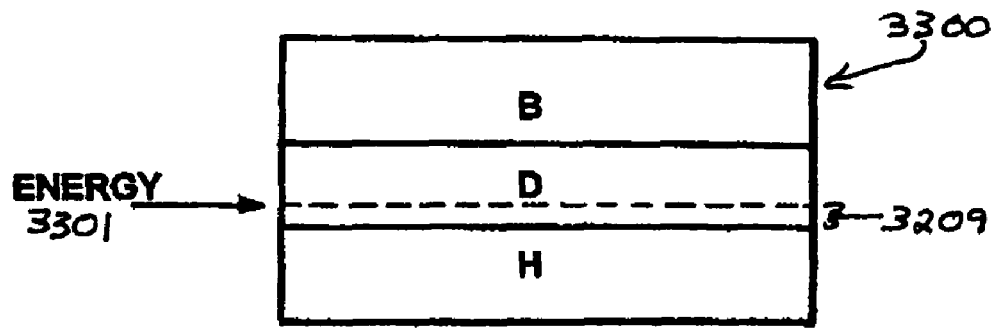
Figure 34:
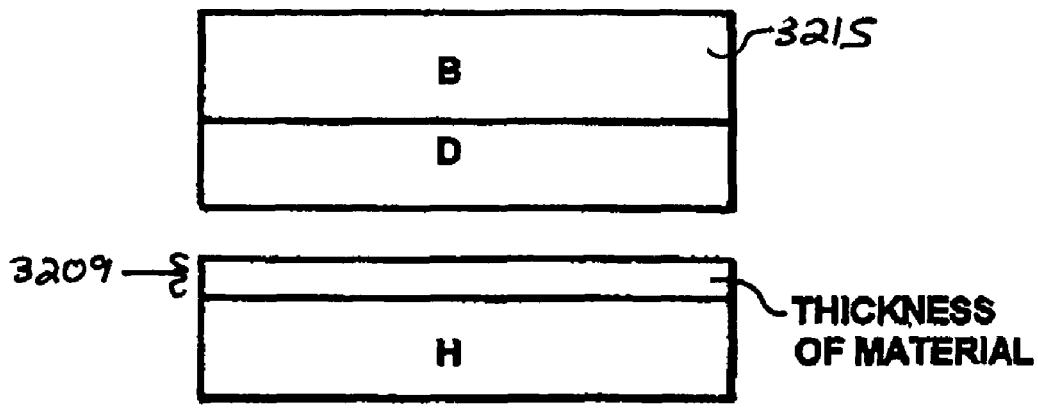

FIGS. 32 through 34 illustrates yet an alternative method for manufacturing multi-layered substrates using a backing member according to embodiments of the present invention. These diagrams are merely examples, which should not unduly limit the scope of the claims herein. One of ordinary skill in the art would recognize many variations, modifications, and alternatives. As shown, the method includes providing a donor substrate 3201 comprising a cleave region 3203, a face 3205, a backside 3207, and a thickness of silicon bearing material 3209 between the face and the cleave region. In a preferred embodiment, the donor substrate has a first deflection characteristic. Preferably, the donor substrate has a somewhat flexible characteristic that is unsuitable for a layer transfer process according to a specific embodiment. The unsuitable nature of the substrate causes excessive roughness, breakage, partial film separation, and the like depending upon the specific embodiment. As merely an example, the donor substrate can be a silicon wafer, a germanium wafer, silicon germanium materials, silicon carbide bearing materials, Group III/V compounds, any combination of these, and others. Of course there can be other variations, modifications, and alternatives.

Depending upon the embodiment, the cleave region can be formed using a variety of techniques. That is, the cleave region can be formed using any suitable combination of implanted particles, deposited layers, diffused materials, patterned regions, and other techniques. In a specific embodiment, the method introduces certain energetic particles using an implant process through a top surface of a donor substrate to a selected depth, which defines a thickness of the material region, termed the "thin film" of material. A variety of techniques can be used to implant the energetic particles into the silicon wafer. These techniques include ion implantation using, for example, beam line ion implantation equipment manufactured from companies such as Applied Materials, Inc. and others. Alternatively, implantation occurs using a plasma immersion ion implantation ("PIII") technique, ion shower, and other non-mass specific techniques. Combination of such techniques may also be used. Of course, techniques used depend upon the application.

Depending upon the application, smaller mass particles are generally selected to reduce a possibility of damage to the material region according to a preferred embodiment. That is, smaller mass particles easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral and or charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the top surface to the selected depth underneath the top surface.

Using hydrogen as the implanted species into a silicon wafer as an example, the implantation process is performed using a specific set of conditions. Implantation dose ranges from about $10^{15}$ to about $10^{18}$ atoms/cm$^2$, and preferably the dose is greater than about $10^{16}$ atoms/cm$^2$. Implantation energy ranges from about 1 KeV to about 1 MeV, and is generally about 50 KeV. Implantation temperature ranges from about 200 or 250 to about 600 Degrees Celsius, and is preferably less than about 400 Degrees Celsius to prevent a possibility of a substantial quantity of hydrogen ions from diffusing out of the implanted silicon wafer. The hydrogen ions can be selectively introduced into the silicon wafer to the selected depth at an accuracy of about +/−0.03 to +/−0.05 microns. Of course, the type of ion used and process conditions depend upon the application.

Effectively, the implanted particles add stress or reduce fracture energy along a plane parallel to the top surface of the donor substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the donor substrate material. It should be noted, however, that implantation does generally cause a certain amount of defects (e.g., microdetects) in the substrate that can typically at least partially be repaired by subsequent heat treatment, e.g., thermal annealing or rapid thermal annealing.

Depending upon the embodiment, there may be other techniques for forming a cleave region and/or cleave layer. As merely an example, such cleave region is formed using other processes, such as those called a Nanocleave™ process of Silicon Genesis Corporation of Santa Clara, Calif., a Smart-Cut™ process of Soitec SA of France, and an Eltran™ process of Canon Inc. of Tokyo, Japan, any like processes, and others. Of course, there may be other variations, modifications, and alternatives.

As also shown, the method provides a handle substrate 3211 in a specific embodiment. The handle substrate can be silicon, glass, quartz, polymeric, or other composites, and the like. In alternative embodiments, the handle substrate can be any homogeneous, graded, or multilayered material, or any combination of these. That is, the handle substrate can be made of almost any monocrystalline, polycrystalline, or even amorphous type substrate. Additionally, the handle substrate can be made of III/V materials such as gallium arsenide, gallium nitride (GaN), and others. Additionally, the handle substrate can be silicon carbide, germanium, silicon, glass or quartz combinations, plastics, and polymers, which have flexible characteristics. The handle substrate can comprise Si, SiGe, SiGe alloys, SiC, and Group II/VI or Group III/V compounds. Any other combinations of materials can also be used, depending upon the specific embodiment.

In a specific embodiment, the handle substrate, which is free from the donor substrate, and donor substrate are both subjected to plasma activated processes. Such plasma activated processes clean and/or activate the surfaces of the substrates. The plasma activated processes are provided using a nitrogen bearing plasma at 20° C. to 40° C. temperature. The plasma activated processes are preferably carried out in dual frequency plasma activation system manufactured by Silicon Genesis Corporation of San Jose, Calif. Of course, there can be other variations, modifications, and alternatives, which have been described herein, as well as outside of the present specification.

Thereafter, each of these substrates is bonded together to form a bonded substrate structure 3213 in a specific embodiment. As shown, the handle substrate has been bonded to the donor substrate. The substrates are preferably bonded using an EVG 850 bonding tool manufactured by Electronic Vision Group or other like processes. Other types of tools such as those manufactured by Karl Suss may also be used. Of course, there can be other variations, modifications, and alternatives. Preferably, bonding between the handle substrate and the donor substrate is substantially permanent and has good reliability.

Accordingly after bonding, the bonded substrate structure is subjected to a bake treatment. The bake treatment maintains the bonded substrate structure at a predetermined temperature and a predetermined time. Preferably, the temperature ranges from about 250 Degrees Celsius to about 400 Degrees Celsius and is preferably about 350 Degrees Celsius for about 1 hour or so for silicon donor and a quartz handle substrates. Depending upon the specific application, there can be other variations, modifications, and alternatives.

In a specific embodiment, the substrates are joined or fused together using a low temperature bonding step. The low temperature bonding process generally ensures that the implanted particles do not place excessive stress on the material region, which can produce an uncontrolled cleave action. In a specific embodiment, the low temperature bonding process occurs by a self-bonding process. In particular, one wafer is stripped to remove oxidation there from (or one substrate is not oxidized). A cleaning solution treats the surface of the wafer to form O—H bonds on the wafer surface. An example of a solution used to clean the wafer is a mixture of hydrogen peroxide and sulfuric acid, and other like solutions. A dryer dries the substrate surfaces to remove any residual liquids or particles from the substrate surfaces. Self-bonding occurs by placing surfaces of cleaned substrates together.

Alternatively, an adhesive disposed on either or both surfaces of the substrates, which bond one substrate to another substrate. In a specific embodiment, the adhesive includes an epoxy, polyimide-type materials, and the like. Spin-on-glass layers can be used to bond one substrate surface onto the face of another. These spin-on-glass ("SOG") materials include, among others, siloxanes or silicates, which are often mixed with alcohol-based solvents or the like. SOG can be a desirable material because of the low temperatures (e.g., 150 to 250 degree C.) often needed to cure the SOG after it is applied to surfaces of the wafers.

Alternatively, a variety of other low temperature techniques can be used to join the donor wafer to the handle substrates. For instance, an electro-static bonding technique can be used to join the two substrates together. In particular, one or both substrate surface(s) is charged to attract to the other substrate surface. Additionally, the donor substrate can be fused to the handle wafer using a variety of other commonly known techniques. Of course, the technique used depends upon the application.

In a preferred embodiment, the present invention provides a backing substrate 3215 to add rigidity to donor substrate structure, which has been bonded to the handle substrate, as illustrated by FIG. 32. Preferably, the backing substrate has a thickness and material that is adequate to provide an effective deflection characteristic of a multilayered structure composed of at least the backing and donor substrates to be suitable for a thickness of material from the donor substrate to be transferred onto the face of the handle substrate.

As merely an example, the backing substrate is a silicon wafer. Such backing substrate has a thickness of 725 microns+/−15 microns and is made of single crystal silicon providing, for example, a 200 millimeter donor/handle/backing substrate structures. Such substrate has a Young's modulus of about 130 Giga Pascal. Other types of materials and certain thicknesses such as plastic, metal, glass, quartz, composites, and the like can be used to provide the rigidity to the combined backing and handle substrate structures. Of course, one of ordinary skill in the art would recognize other variations, modifications, and alternatives.

In a specific embodiment, the method performs a cleaning and/or activating process (e.g., plasma activated process) on surfaces of the backing and/or donor substrates. Such plasma activating processes clean and/or activate the surfaces of the substrates. The plasma activated processes are provided using a nitrogen bearing plasma at 20° C.-40° C. temperature. The plasma activated processes are preferably carried out in dual frequency plasma activation system manufactured by Silicon Genesis Corporation of San Jose, Calif. Of course, there can be other variations, modifications, and alternatives.

Referring again to FIG. 32, the method initiates engagement of the backing substrate to the backside of the donor substrate according to a specific embodiment. The method preferably temporarily attaches the backing substrate to the backside of the donor substrate to firmly engage the backing substrate to the donor substrate to form a multilayered bonded substrate structure 3300 as shown in FIG. 33. As merely an example, a silicon wafer backing substrate firmly attaches to a silicon wafer donor substrate without any other modifications and/or alterations according to a preferred embodiment. Here, the silicon wafer backing substrate has a very thin coating of native oxide, which bonds to surfaces of the silicon wafer donor substrate, although there may be embodiments without such native oxide.

The method performs a controlled cleaving process on the multilayered bonded substrate structure 3300, as illustrated by FIG. 33. The controlled cleaving process provided a selected energy 3301 within a portion of the cleave region of the donor substrate. As merely an example, the controlled cleaving process has been described in U.S. Pat. No. 6,013, 563 titled Controlled Cleaving Process, commonly assigned to Silicon Genesis Corporation of San Jose, Calif., and hereby incorporated by reference for all purposes. Next, the method frees the thickness of material from the donor substrate to completely remove the thickness of material from the donor substrate, as shown by FIG. 34.

In a preferred embodiment, the method removes the backing substrate from the donor substrate. In a specific embodiment, the attachment between the backing substrate and donor substrate is temporary and can be removed with mechanical force without damaging either substrates. In a specific embodiment, a controlled cleaving process may be used to detaching the backing substrate from the donor substrate. In a preferred embodiment, the backing substrate remains attached to the donor substrate for repeated use according to a specific embodiment. Of course, there can be other variations, modifications, and alternatives.

In a specific embodiment, the method forms devices onto surfaces of the thickness of material, which has been transferred to the handle substrate. Such devices can include integrated semiconductor devices, photonic and/or optoelectronic devices (e.g., light valves), piezoelectronic devices, microelectromechanical systems ("MEMS"), nano-technology structures, sensors, actuators, solar cells, flat panel displays (e.g., LCD, AMLCD), biological and biomedical devices, and the like. Such devices can be made using deposition, etching, implantation, photo masking processes, any combination of these, and the like. Of course, there can be other variations, modifications, and alternatives. Further details of alternative embodiments of the present invention can be found throughout the present specification and more particularly below.

In a preferred embodiment, the present invention provides a method for manufacturing multi-layered substrates comprising transparent materials as follows.

1. Provide a donor substrate comprising a cleave region, a thickness of silicon bearing material;
2. Provide a transparent handle substrate, which has a first deflection characteristic a backside and a face;
3. Perform a cleaning and/or activating process (e.g., plasma activated process) on surfaces of the handle and donor substrates;
4. Bond the surface region of the donor substrate to the face of the transparent handle substrate;
5. Provide a backing substrate that is adequate to provide an effective deflection characteristic of a multilayered structure composed of at least the backing substrate, handle substrate, and donor substrate to be suitable for a thickness of silicon bearing material to be transferred onto the face of the handle substrate;
6. Perform a cleaning and/or activating process (e.g., plasma activated process) on surfaces of the backing and transparent handle substrates;
7. Initiate engagement of the backing substrate to the backside of the transparent handle substrate that is coupled to the donor substrate;
8. Temporarily attaching the backing substrate to the backside of the transparent handle substrate to firmly engage the backing substrate to the transparent handle substrate to form a multilayered structure,
9. Initiate a controlled cleaving process within a portion of the cleave region of the donor substrate to begin removal of the thickness of silicon bearing material from the donor substrate at a portion of the cleave region;
10. Free the thickness of material from the donor substrate to completely remove the thickness of material from the donor substrate;
11. Optionally, maintain the multilayered substrate including the handle substrate, donor substrate, and backing substrate at about room temperature (e.g., 21 Degrees Celsius) and less to prevent permanent attachment of the backing substrate to the transparent handle substrate;
12. Remove the backing substrate from the transparent handle substrate; and
13. Perform other steps, as desired.

The above sequence of steps provides a method according to an embodiment of the present invention. As shown, the method uses a combination of steps including a way of forming a multilayered substrate structure using a stiffening substrate on a substrate having undesirable bending characteristics. Other alternatives can also be provided where steps are added, one or more steps are removed, or one or more steps are provided in a different sequence without departing from the scope of the claims herein. Further details of the present method can be found throughout the present specification and more particularly below.

FIGS. 35 through 44 illustrates a preferred method for manufacturing multi-layered substrates using a backing member according to embodiments of the present invention. These diagrams are merely examples, which should not unduly limit the scope of the claims herein. One of ordinary skill in the art would recognize many variations, modifications, and alternatives. As shown in FIG. 35, the method includes providing a donor substrate 3501 comprising a cleave region 3503, a face 3507, a backside 3509, and a thickness of silicon bearing material 3511 between the face and the cleave region. As merely an example, the donor substrate can be a silicon wafer, a germanium wafer, silicon carbide bearing materials, Group III/V compounds, any combination of these, and others. The donor substrate can comprise Si, SiGe, SiGe alloys, SiC, and Group II/VI or Group III/V compounds.

The method provides a transparent handle substrate 3513, which has a first deflection characteristic, a backside, and a face, also shown in FIG. 35. The transparent handle substrate can be glass, quartz, polymeric, or other composites, and the like. As merely an example, the transparent substrate has a thickness of about 800±20 microns, a backside surface, and a face. The transparent substrate is quartz, which is called synthetic quartz (e.g., VISIL-SQ,SX) manufactured by Shin-Etsu Chemical Co., Ltd. of Tokyo, Japan. The surface roughness of the synthetic quartz is about 2 to 3 Angstroms surface roughness of a ten micron by a ten micron atomic force microscope ("AFM") measurement. Of course, there can be other variations, modifications, and alternatives.

Referring to FIG. 36, the transparent handle substrate and a silicon wafer are both subjected to plasma activated processes 3601. Such plasma activated processes clean and/or activate the surfaces of the substrates. The plasma activated processes are provided using a nitrogen bearing plasma at 20° C. to 40° C. temperature. The plasma activated processes are preferably carried out in dual frequency plasma activation system manufactured by Silicon Genesis Corporation of San Jose, Calif. Of course, there can be other variations, modifications, and alternatives.

Figure 37:
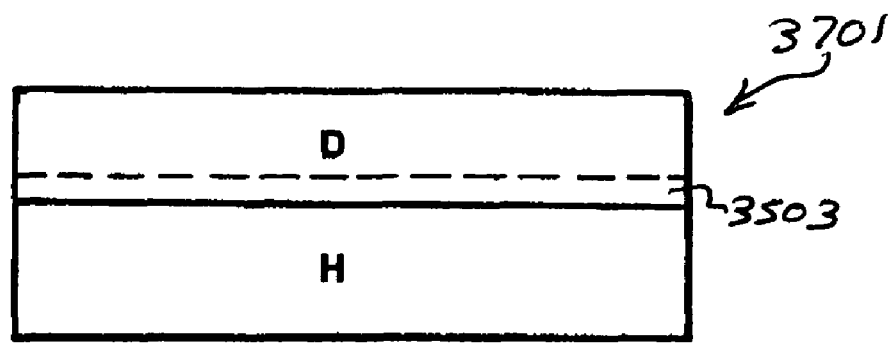

Thereafter, the transparent handle substrate and the silicon wafer are bonded together to form a bonded substrate structure 3701, as illustrated by FIG. 37. As shown, the transparent substrate has been bonded to the silicon wafer. The substrates are preferably bonded using an EVG 850 bonding tool manufactured by Electronic Vision Group. Other types of tools such as those manufactured by Karl Suss may also be used. Of course, there can be other variations, modifications, and alternatives. Preferably, bonding between the transparent substrate and the silicon wafer is substantially permanent and has good reliability.

Figure 38:
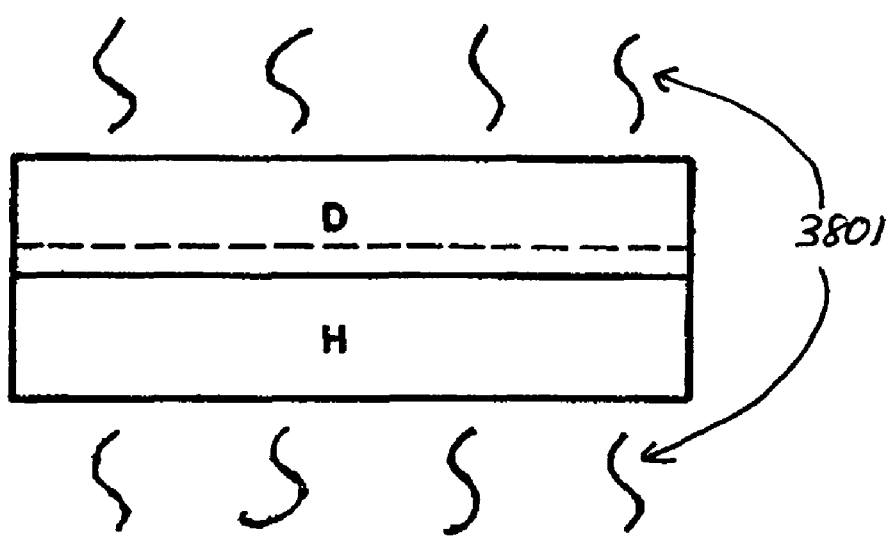

Accordingly after bonding, the bonded substrate structure is subjected to a bake treatment 3801, as illustrated by FIG. 38. The bake treatment maintains the bonded substrate structure at a predetermined temperature and predetermined time. Preferably, the temperature ranges from about 250 Degrees Celsius to about 400 Degrees Celsius and is preferably about 350 Degrees Celsius for about 1 hour or so. Depending upon the specific application, there can be other variations, modifications, and alternatives.

Figure 39:
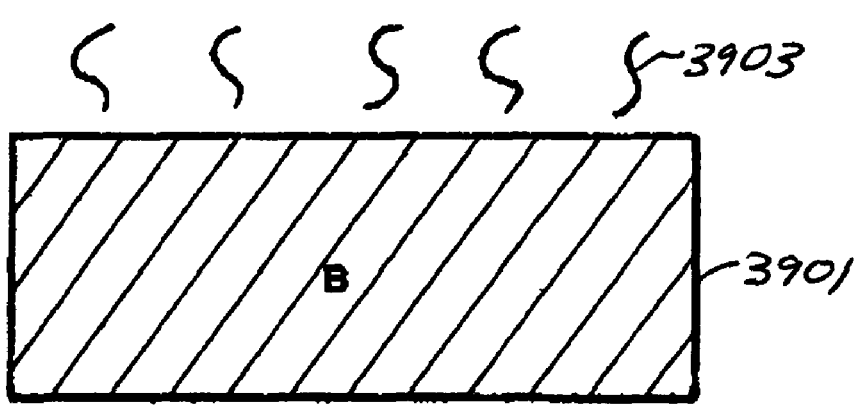

In a preferred embodiment, the present invention provides a backing substrate 3901 to add rigidity to the bonded donor and handle substrate structures, as illustrated by FIG. 39. Preferably, the backing substrate has a thickness and material that is adequate to provide an effective deflection characteristic of a multilayered structure composed of at least the backing substrate, the handle substrate, and the donor substrate to be suitable for a thickness of silicon bearing material from the donor substrate to be transferred onto the face of the handle substrate.

As merely an example, the backing substrate is a silicon wafer for a quartz handle substrate. Such backing substrate, for example, has a thickness of 725 microns+/−15 microns, and is made of single crystal silicon to use in, for example, a 200 millimeter donor/handle/backing substrate structures.

Such backing substrate has a Young's modulus of about 130 Giga Pascal. Other types of materials and certain thicknesses such as plastic, metal, glass, quartz, composites, and the like can be used to provide the rigidity to the combined handle and donor substrate structures. Of course, one of ordinary skill in the art would recognize other variations, modifications, and alternatives.

In a specific embodiment, the method performs a cleaning and/or activating process 3903 (e.g., plasma activated process) on surface of the backing substrate and/or transparent handle substrate, which is also illustrated by FIG. 39. Such plasma activating processes clean and/or activate the surfaces of the substrates. The plasma activated processes are provided using a nitrogen bearing plasma at 20° C.–40° C. temperature. The plasma activated processes are preferably carried out in dual frequency plasma activation system manufactured by Silicon Genesis Corporation of San Jose, Calif. Of course, there can be other variations, modifications, and alternatives.

Figure 40:
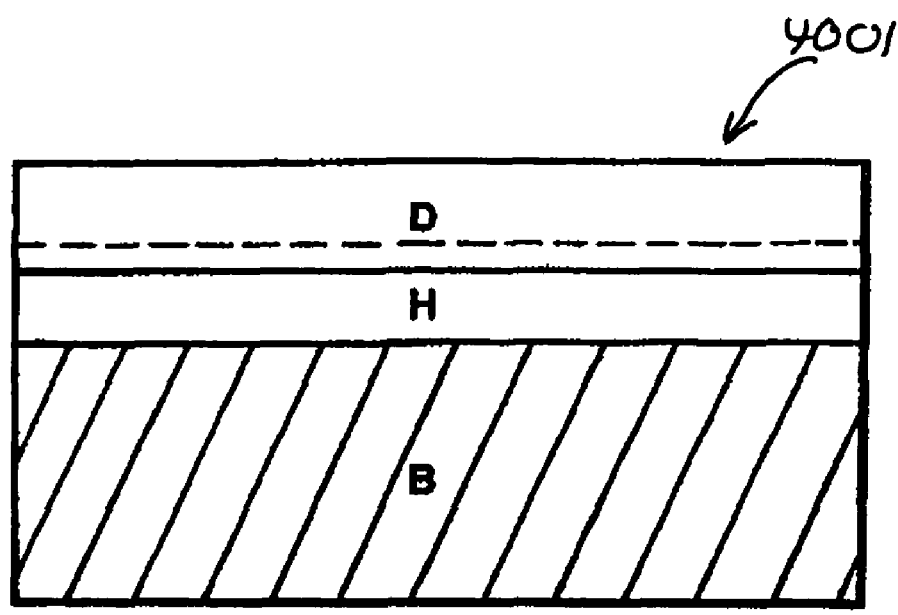

Referring to FIG. 40, the method initiates engagement of the backing substrate to the backside of the transparent handle substrate that is coupled to the donor substrate. The method preferably temporarily attaches the backing substrate to the backside of the transparent handle substrate to firmly engage the backing substrate to the transparent handle substrate to form a multilayered structure 4001. The silicon wafer firmly attaches to the quartz plate without any other modifications and/or alterations according to a preferred embodiment. Here, the silicon wafer has a very thin coating of native oxide, which bonds to surfaces of the quartz plate, although there may be embodiments without such native oxide.

Figure 41:
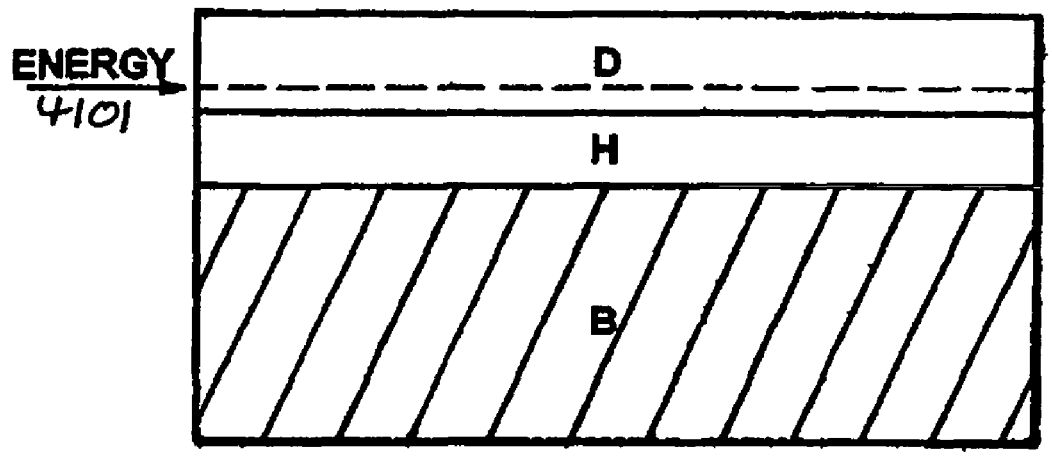
Figure 42:
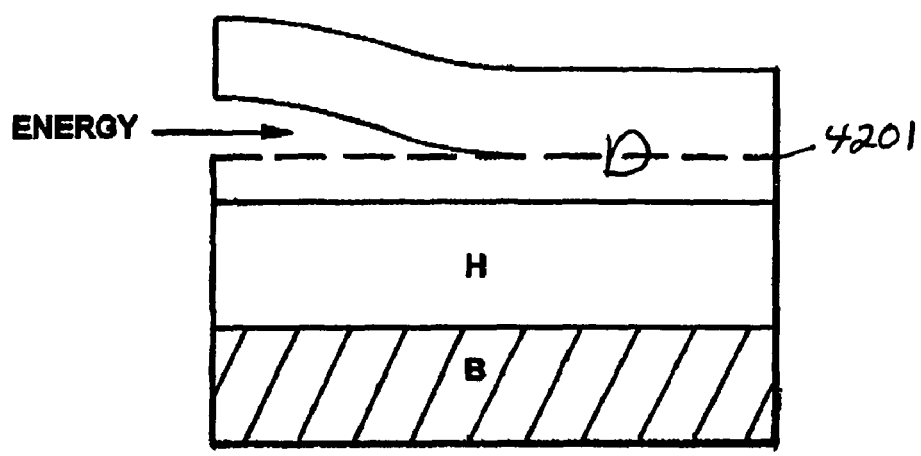
Figure 43:
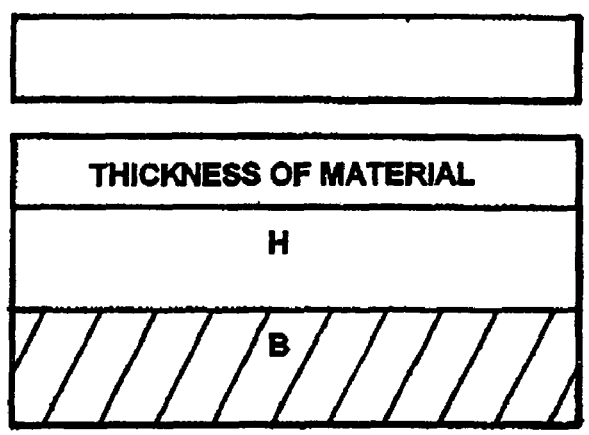

The method performs a controlled cleaving process on the bonded substrate structure in the multilayer structure, as illustrated by FIGS. 41 and 42. The controlled cleaving process provided a selected energy 4101 within a portion of the cleave region 4201 of the donor substrate. As merely an example, the controlled cleaving process has been described in U.S. Pat. No. 6,013,563 titled Controlled Cleaving Process, commonly assigned to Silicon Genesis Corporation of San Jose, Calif., and hereby incorporated by reference for all purposes. Next, the method frees the thickness of silicon bearing material from the donor substrate to completely remove the thickness of silicon bearing material from the donor substrate, as shown by FIG. 43.

Figure 44:
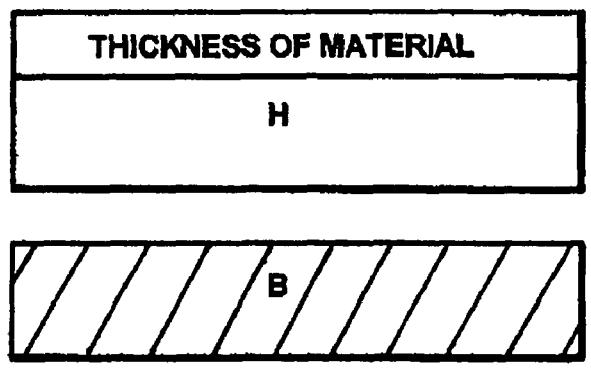

In a preferred embodiment, the method removes the backing substrate from the transparent handle substrate, as illustrated by FIG. 44. In a preferred embodiment, the attachment between the backing substrate and handle substrate is temporary and can be removed with mechanical force without damaging either substrates. In a specific embodiment, the backing substrate and handle are attached after the donor substrate has been attached to the handle substrate to maintain low temperature operations from a step of attaching the backing substrate. Such low temperature, which is maintained below 200 Degrees Celsius, allows for the backing substrate to be easily removed from the handle substrate for a silicon substrate and quartz plate specific embodiment. Of course, there can be other variations, modifications, and alternatives.

In a preferred embodiment, the present invention provides a multilayered substrate structure. The structure has a transparent handle substrate, which is quartz or glass. The transparent handle substrate has a thickness of less than about 10 millimeters and a Young's modulus ranging from about 1 Mega Pascal to about 130 Giga Pascal. The structure has a thickness of silicon bearing material coupled to the transparent handle substrate. Preferably, the thickness of silicon bearing material ranges from about 100 micrometers to about 5 millimeters. A cleaved surface is on the thickness of silicon bearing material. Preferably, the surface roughness characterizing the cleaved film is less than 100 Angstroms after cleaving without any polishing processes, although the surface may be polished to further reduce surface roughness according to alternative embodiments. Such thickness for the given material on the handle substrate generally cannot be effectively transferred by way of conventional techniques. Of course, there can be other variations, modifications, and alternatives.

In a specific embodiment, the method forms devices onto surfaces of the thickness of silicon bearing material. Such devices can include integrated semiconductor devices, photonic and/or optoelectronic devices (e.g., light valves), piezoelectronic devices, microelectromechanical systems ("MEMS"), nano-technology structures, sensors, actuators, solar cells, flat panel displays (e.g., LCD, AMLCD), biological and biomedical devices, and the like. Such devices can be made using deposition, etching, implantation, photo masking processes, any combination of these, and the like. Of course, there can be other variations, modifications, and alternatives. Further details of alternative embodiments of the present invention can be found throughout the present specification and more particularly below.

Although the above description is in terms of a silicon wafer, other substrates may also be used. For example, the substrate can be almost any monocrystalline, polycrystalline, or even amorphous type substrate. Additionally, the substrate can be made of III/V materials such as gallium arsenide, gallium nitride (GaN), and others. Additionally, the substrate can be silicon carbide, germanium, silicon, glass or quartz combinations, plastics, and polymers, which have flexible characteristics. Any other combinations of materials can also be used, depending upon the specific embodiment. A multi-layered substrate can also be used according to the present invention. The multi-layered substrate includes a silicon-on-insulator substrate, a variety of sandwiched layers on a semiconductor substrate, and numerous other types of substrates. Additionally, the embodiments above were generally in terms of providing a pulse of energy to initiate a controlled cleaving action. The pulse can be replaced by energy that is scanned across a selected region of the substrate to initiate the controlled cleaving action. Energy can also be scanned across selected regions of the substrate to sustain or maintain the controlled cleaving action. Moreover, the above embodiments have been described in terms of adding a backing substrate to either the donor or handle substrate. It would be recognized that the backing substrate can be applied to both handle and donor substrate according to certain embodiments. One of ordinary skill in the art would easily recognize a variety of alternatives, modifications, and variations, which can be used according to the present invention.

In a specific embodiment, the present invention provides a method for processing a film of material using a chuck or platen design. Such method is briefly outlined as follows:

1. Provide a donor substrate having a face, a backside, a cleave plane, and a thickness of material defined between the face and the cleave plane;

2. Provide a handle substrate having a first deflection characteristic, which is unsuitable for a thickness of material to be transferred onto a face of the donor substrate, while the handle substrate is coupled to the donor substrate;

3. Perform plasma activated process on surfaces of the donor and handle substrates;

4. Bond the face of the donor substrate to the handle substrate to form a multilayered structure;

5. Transfer the multilayered structure onto a platen structure, which is housed in a chamber;

6. Align the multilayer structure onto the platen structure;

7. Couple the multilayer structure onto the platen structure;

8. Firmly engage the multilayered structure onto the platen structure to cause an effective deflection characteristic of the multilayered structure to be suitable for the thickness of material to be transferred onto the face of the handle substrate;

9. Cleave a portion of the thickness of material while the multilayered structure remains engaged with the platen structure; and 10. Perform other steps, as desired.

The above sequence of steps provides a method according to an embodiment of the present invention. As shown, the method uses a combination of steps including a way of forming a multilayered substrate structure using a stiffening substrate on a substrate having undesirable bending characteristics. Other alternatives can also be provided where steps are added, one or more steps are removed, or one or more steps are provided in a different sequence without departing from the scope of the claims herein. Further details of the present method can be found throughout the present specification and more particularly below.

Figure 45:
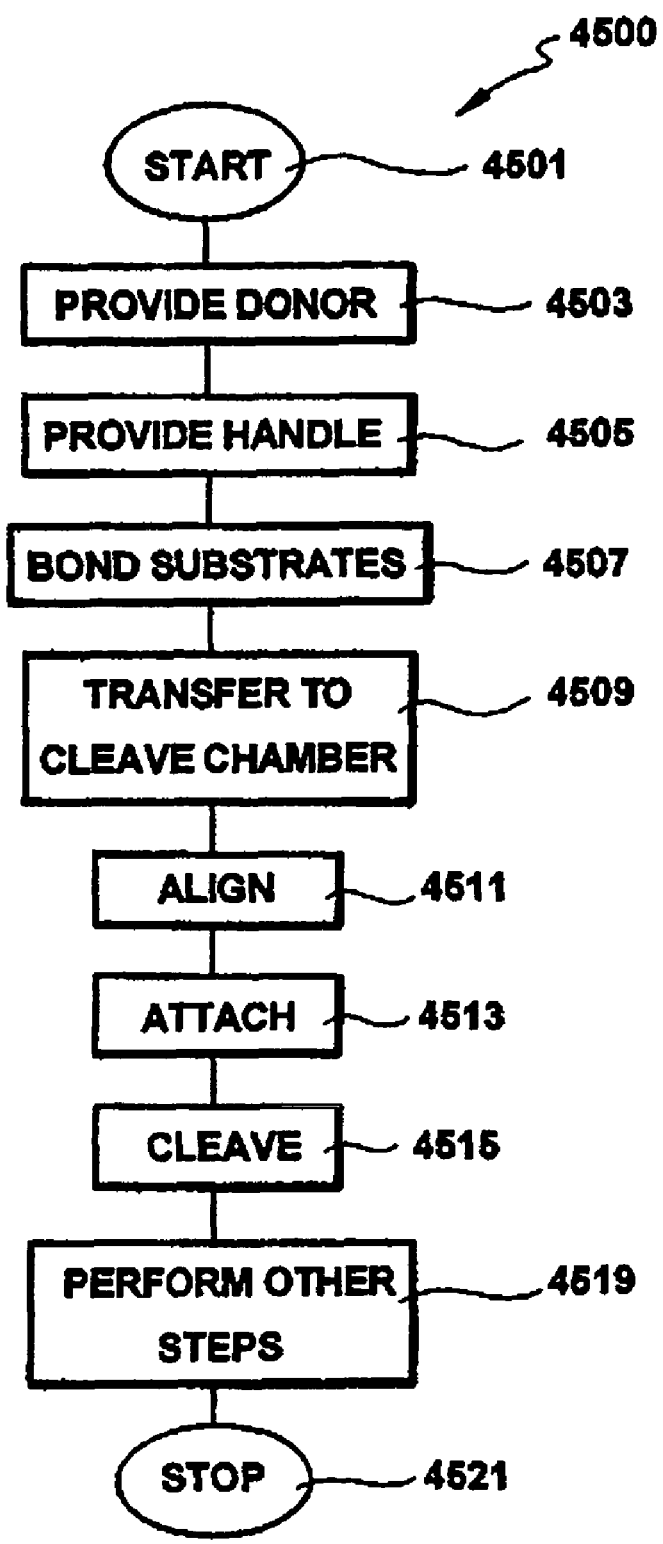
FIGS. 45 through 47 illustrate an alternative preferred method for manufacturing multi-layered substrates using a backing member according to embodiments of the present invention.

FIGS. 45 through 48 illustrates a simplified flow diagram 4500 and simplified cross-sectional view diagrams of a preferred method for manufacturing multi-layered substrates using a backing member and platen structure according to embodiments of the present invention. These diagrams are merely examples, which should not unduly limit the scope of the claims herein. One of ordinary skill in the art would recognize many variations, modifications, and alternatives. As shown in FIG. 45, the method begins at start, step 4501. The method includes providing a donor substrate (step 4503) comprising a cleave region, a face, a backside, and a thickness of silicon bearing material between the face and the cleave region. As merely an example, the donor substrate can be a silicon wafer, a germanium wafer, silicon carbide bearing materials, Group III/V compounds, any combination of these, and others.

The method provides a transparent handle substrate (step 4505), which has a first deflection characteristic, a backside, and a face. The transparent handle substrate can be glass, quartz, polymeric, or other composites, and the like. As merely an example, the transparent substrate has a thickness of about 800±20 microns, a backside surface, and a face. The transparent substrate is quartz, which is called synthetic quartz (e.g., VISIL-SQ,SX) manufactured by Shin-Etsu Chemical Co., Ltd. of Tokyo, Japan. The surface roughness of the quartz is about 2 to 3 Angstroms surface roughness of a ten micron by a ten micron atomic force microscope ("AFM") measurement. Of course, there can be other variations, modifications, and alternatives.

In a specific embodiment, the transparent handle substrate and a silicon wafer are both and/or each subjected to plasma activated processes. Such plasma activated processes clean and/or activate the surfaces of the substrates. The plasma activated processes are provided using a nitrogen bearing plasma at 20° C. to 40° C. temperature. The plasma activated processes are preferably carried out in dual frequency plasma activation system manufactured by Silicon Genesis Corporation of San Jose, Calif. Of course, there can be other variations, modifications, and alternatives.

Thereafter, each of these substrates are bonded together, step 4507, to form a bonded substrate structure. The substrates are preferably bonded using an EVG 850 bonding tool manufactured by Electronic Vision Group. Other types of tools such as those manufactured by Karl Suss may also be used. Of course, there can be other variations, modifications, and alternatives. Preferably, bonding between the transparent handle substrate and the silicon wafer is substantially permanent and has good reliability.

Accordingly, after bonding, the bonded substrate structure is subjected to a bake treatment in a specific embodiment. The bake treatment maintains the bonded substrate at a predetermined temperature and predetermined time. Preferably, the temperature ranges from about 250 Degrees Celsius to about 400 Degrees Celsius and is preferably about 350 Degrees Celsius for about 1 hour or so. Depending upon the specific application, there can be other variations, modifications, and alternatives.

Figure 46:
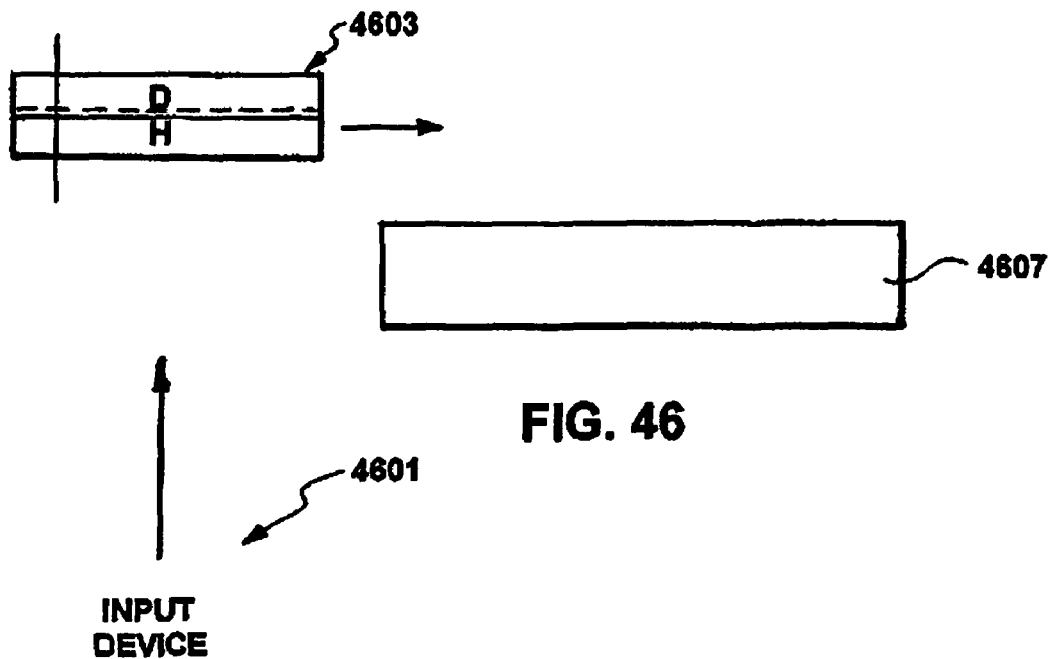

In a preferred embodiment, the method transfers (step 4509) the bonded substrate structure 4603 to an input device 4601 using a transfer device, as illustrated by the simplified diagram of FIG. 46. The input device is operably coupled to a platen device 4607, as also illustrated by FIG. 46. The input device can be a chamber or other station, which holds and/or maintains the bonded substrate structure in place. The method transfers the bonded substrate structure from the input device to the platen device via transfer device. The method aligns (step 4511) the bonded substrate structure onto a selected portion of a surface region of the platen also using the transfer device. The platen includes a porous region 4701, which couples to an input/output region. The input/output region is coupled to an engagement device 4703, which is coupled to an energy source 4705. The energy source is preferably a vacuum pump or the like. The vacuum pump maintains a vacuum in the pores to firmly engaging and/or attaching (step 4513) the bonded substrate structure onto the surface region of the platen structure to cause an effective deflection characteristic of the bonded substrate structure to be suitable for the thickness of material to be transferred onto the face of the handle substrate.

In a preferred embodiment, the platen device can be made using a suitable porous material. That is, the platen device can be made of porous ceramics, porous plastics, and others. An example of a porous plastics material can include porous polyethylene (e.g., ultra high density polyethylene) and other like materials. The pores can range in average size from about 70 microns to about 5 microns or 5 microns to 10 microns, depending upon the specific embodiment. The number of pores can range from about 40 to 50 percent of void volume in a specific embodiment. A surface region of the platen device has an end to end uniformity of less than 20 microns or 30 microns, which is a distance from a center region to any outer region. Alternative, such uniformity may be a focal plane deviation according to certain embodiments. Such deviation is no more than about 20 microns for a 200 millimeter silicon substrate in a specific embodiment. Preferably, the porous plastic material is rigid and shatterproof, depending upon the specific embodiment. An example of such plastic material can be fluidizing plate porous plastic of Genpore, which is a Division of General Polymeric Corporation of 1136 Morgantown Rd.•P.O. Box 380•Reading, Pa. 19607, but may also be from other companies. A benefit of such porous plastic material is certain pores may not be completely covered but the ones that are coupled to the backside of a substrate still maintain the substrate in place. That is, certain leakage may occur without causing any limitations to the present method and structures according to certain embodiments.

In a specific embodiment, a blocking layer can be applied to other portions of the porous material to provide selective application of a substrate. That is, in certain regions, which are not exposed to the substrate, a blocking layer 4711 such as a material including a polyimide tape called Kapton™ tape manufactured by DuPont High Performance Materials, P.O.

Figure 47:
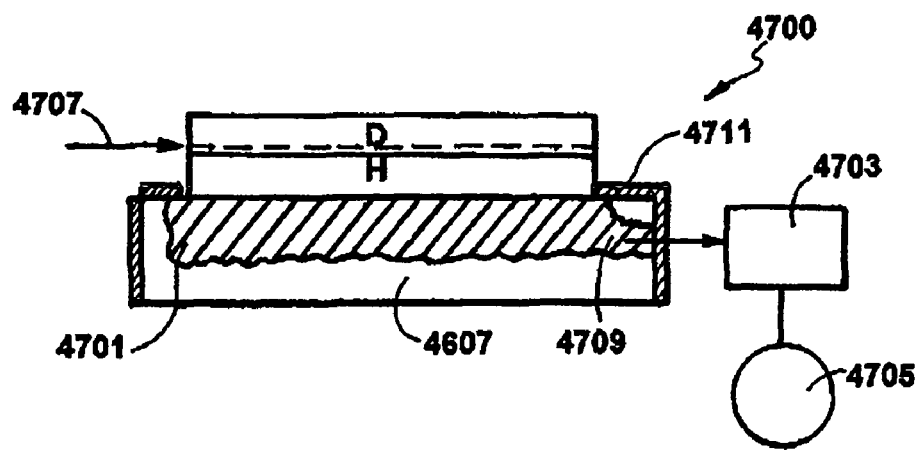

Box 89, Route 23 South and DuPont Road, Circleville, Ohio 43113 is applied to surfaces of the porous material, as shown in the simplified diagram of FIG. 47. Such tape restricts vacuum to such regions, while exposing regions that directly interface with the backside of the bonded substrate structure. Other types of materials can also be used depending upon the specific embodiment. As an example, a platen structure for a vacuum chuck had a thickness of about ⅛ inch thickness or thicker of porous plastic material. Also as an example, the vacuum chuck stiffens a quartz wafer relative to a silicon donor so that the quartz wafer does not bend more than the silicon given the same pulling force according to a specific embodiment.

In a specific embodiment, the platen device is provided in a cleaving tool. The cleaving tool often has the platen device, a mechanical cleave member, which initiates cleaving, and a static fluid source and/or mechanical detachment member, which mechanically pulls the substrates apart using a controlled cleaving action and attachment members (e.g., vacuum cups, adhesive tape) to upper and lower substrate portions. An example of such cleaving tool is called an automatic rTCCP™ tool manufactured by Silicon Genesis Corporation of San Jose, Calif. Such cleaving tool may also be replaced by other cleaving tools from other companies. Of course, there can be other variations, modifications, and alternatives.

Figure 48:
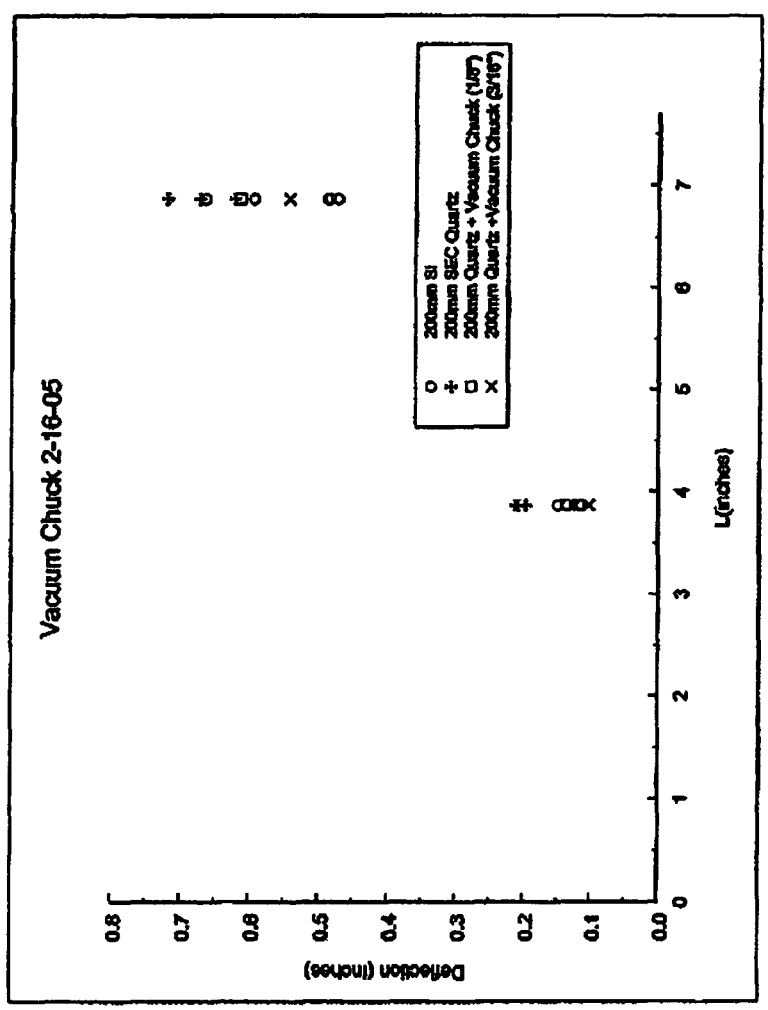
FIGS. 48 through 51 are simplified diagrams illustrating sample experiments and calculations using the present layer transfer method according to embodiments of the present invention.

Referring to FIG. 48, we have provided certain data that plots deflection against thicknesses of various materials. Such materials include silicon, quartz, and plastic, which is used for the platen. As shown, the data show deflection of the silicon (o), quartz (0.82 mm thickness) (+), and two plastic chucks (⅛" thick ( ) and 3/16" thick(X)) with two values of bending length, L, at 0.6 Kilogram Force (1.32 lbs). As shown, the quartz deflects more than silicon. With the ⅛" plastic backing on the quartz, the quartz/plastic pair deflects similar to the silicon. With the thicker plastic (3/16") on the quartz, the quartz/plastic now deflects less than the silicon for L=4" (generally the most reproducible length regardless of material). Of course, there can be other variations, modifications, and alternatives.

Depending upon the embodiment, there can be other variations to the platen device. That is, the platen device can be purely mechanical in nature and/or electrostatic and/or other suitable technique for holding the multilayered substrate in place. The platen device effectively stiffens the bonded substrate structure into a rigid form, which can be subjected to a cleaving process. The platen device can also be applied to the donor substrate although application of the handle substrate has been described. The platen device can also be applied to both the donor and handle substrates to provide a rigid structure that can be subjected to a cleaving process, including a controlled cleaving process, which uses a propagating cleave from to detach a thickness of material from the donor substrate.

In a specific embodiment, the method performs a controlled cleaving process (step 4515) on the bonded substrate structure, as illustrated by FIGS. 45 and 47. The controlled cleaving process provided a selected energy within a portion of the cleave region 4701 of the donor substrate. As merely an example, the controlled cleaving process has been described in U.S. Pat. No. 6,013,563 titled Controlled Cleaving Process, commonly assigned to Silicon Genesis Corporation of San Jose, Calif., and hereby incorporated by reference for all purposes. As merely an example, the controlled cleaving process uses a combination of mechanical pressure from energy source 4705. As shown in FIG. 47, the energy source is coupled to the platen device. In a preferred embodiment, the energy source is adapted to cleave a portion of the thickness of material while the surface region of the multilayered structure remains engaged with the platen device. Next, the method frees the thickness of material from the donor substrate to completely remove the thickness of material from the donor substrate.

In a preferred embodiment, the method removes the backing substrate from the transparent handle substrate. In a preferred embodiment, the attachment between the backing substrate and handle substrate is temporary and can be removed with mechanical force without damaging either substrates. In a specific embodiment, the backing substrate and handle are attached after the donor substrate has been attached to the handle substrate to maintain low temperature operations from a step of attaching the backing substrate. Such low temperature, which is maintained below 200 Degrees Celsius, allows for the backing substrate to be easily removed from the handle substrate for a silicon substrate and quartz plate specific embodiment. Depending upon the specific embodiment, the method can perform other steps 4519. The method stops at step 4521. Of course, there can be other variations, modifications, and alternatives.

In a preferred embodiment, the present invention provides a multilayered substrate structure. The structure has a transparent handle substrate, which is quartz or glass. The handle substrate has a thickness of less than about 10 millimeters and a Young's modulus ranging from about 1 Mega Pascal to about 130 Giga Pascal. The structure has a thickness of silicon bearing material coupled to the transparent handle substrate. Preferably, the thickness of silicon bearing material ranges from about 100 micrometers to about 5 millimeters. A cleaved surface is on the thickness of silicon bearing material. Preferably, the surface roughness characterizing the cleaved film is less than 100 Angstroms after cleaving without any polishing processes, although the surface may be polished to further reduce surface roughness according to alternative embodiments. Such thickness of the silicon bearing material on the handle substrate generally cannot be effectively transferred by way of conventional techniques. Of course, there can be other variations, modifications, and alternatives.

In a specific embodiment, the method forms devices onto surfaces of the thickness of silicon bearing material. Such devices can include integrated semiconductor devices, photonic and/or optoelectronic devices (e.g., light valves), piezoelectronic devices, microelectromechanical systems ("MEMS"), nano-technology structures, sensors, actuators, solar cells, flat panel displays (e.g., LCD, AMLCD), biological and biomedical devices, and the like. Such devices can be made using deposition, etching, implantation, photo masking processes, any combination of these, and the like. Of course, there can be other variations, modifications, and alternatives.

While the above is a full description of the specific embodiments, various modifications, alternative constructions and equivalents may be used. Therefore, the above description and illustrations should not be taken as limiting the scope of the present invention which is defined by the appended claims.

EXAMPLES

Figure 50:
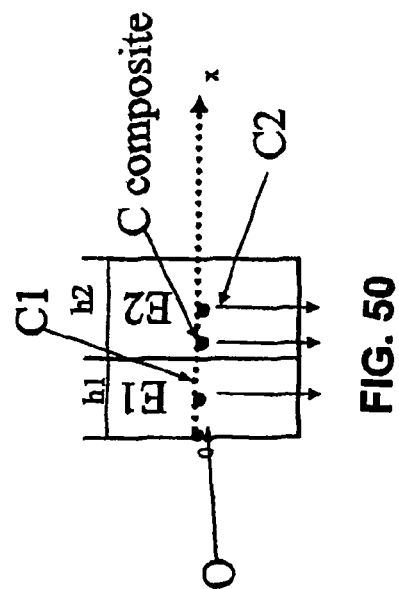
Figure 49:
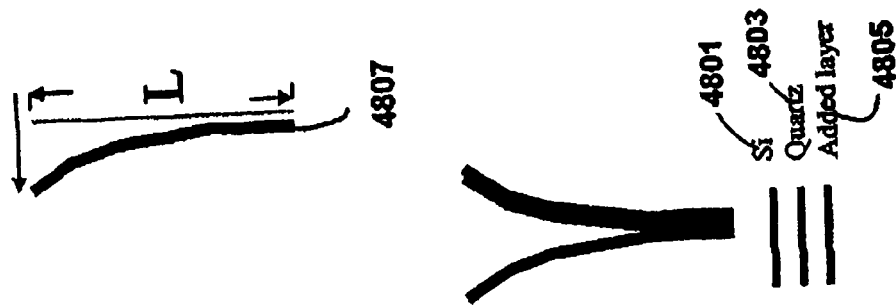

To prove the principle and operation of the present invention, we performed various experiments using certain calculations. These experiments are merely examples, which should not unduly limit the scope of the claims herein. One of ordinary skill in the art would recognize many variations, modifications, and alternatives. Referring to FIGS. 48 through 50, we have provided an example using a silicon substrate 4801, a quartz substrate 4803, and a backing layer 4905, which is called the "added layer." As also shown, a cantilever of length, L 4807, operated upon by an end force, F, should have a deflection given by:

$$\text{Deflection} = F*L^3/(3*E*I) \qquad \text{Equation 1}$$

where F is the force operating at the cantilever end;
where I is the AREA moment of inertia of the beam; and
E is the Young's modulus.

In the present example, quartz and silicon have different E values. Quartz and silicon also have slightly different thicknesses. Accordingly, we expect a bending characteristic of the two wafers (i.e., quartz and silicon) to differ because the stiffness and shapes differ. As an example, we have prepared a bonded pair of wafers including one made of silicon and the other made of quartz. The bonded pair has been considered as two cantilevers face to face. In the example, an additional layer has been added or bonded to the more flexible quartz wafer, which makes a composite structure with increased thickness and stiffness that match the stiffness of the silicon wafer. We have been able to understand exactly how the Young's modulus of the added layer and its thickness impacts the stiffness of the proposed composite in this example.

Without loss of generality, we can assume that the shapes of the wafers and added layers have rectangular cross-sections with width=1 and an end force=1 in this example. We matched the stiffness when the deflection for the silicon wafer and the composite structure stiffness using equation 1 are matched, although other values may work as well.

Under our assumptions, the deflection of the silicon wafer with a thickness of 7.25E-4 meters and E<110> of 169 Giga Pascal would be 6.21E-2 meters. As merely an example, fused silicon dioxide (e.g., quartz) has a reported E value of 73 Giga Pascal. Assuming its thickness to be 8E-4 meters. Its deflection under the above assumptions would be 1.07E-1 meters.

Therefore the quartz wafer should include a thickness of another layer to make a composite with stiffness equal to that of the 725 micron silicon wafer. A stiffness of a two (2) layer composite can be determined using the substitution below:

$$E*I => E1*I1' + E2*I2'$$

or $$E*I(\text{composite}) = E1*I1' + E2*I2' \qquad \text{Equation 2}$$

In a specific embodiment, the prime indicates that the area moment of inertia should not be calculated from the center of mass of the individual layers but from the neutral strain axis of the composite. The example given is of a pair of aluminum layers formed into a composite around a polyurethane core. A foam core would contribute negligibly to the stiffness of the composite in and of itself, but by separating the two layers of aluminum, the composite stiffness is generally greater than that of a double thickness of aluminum (as long as the foam core does not break in between). The composite stiffness is accounted for in equation 2 by using I1' and I2'

In this example, we have a simple relationship between the area moment of inertia rotated on an axis about its cross sectional center of mass (Icm) and the area moment of inertia rotated about any other parallel axis. It is given by:

$$I' = I_{cm} + A*d^2 \qquad \text{Equation 3}$$

where A is the cross sectional area; and
d is the distance to the parallel axis from the center of mass of the cross section.

Referring now to FIG. 49, we let C1 and C2 be the center of mass of any two layers of thickness h1 and h2. Drawing an axis x through C1 and C2, we can solve for C composite's x axis distance, D, by taking E weighted clockwise moments about the axes O (coming out of the paper) such that the moment due to E1h1 acting at C1 plus the moment of E2h2 acting at C2 is set equal the total E weighted moment acting at C composite to write the equation:

$$h1E1*(h1/2) + (h1+h2/2)*h2E2 = D*(h1E1+h2E2) \qquad \text{Equation 4}$$

Because D is the distance in the x direction of C composite, we can solve for two other distances. The distance D1 from C1 to C composite is then given by $$D1 = D - h1/2 \qquad \text{Equation 5}$$

The distance D2 from C composite to C2 is then given by $$D2 = (h1 + h2/2) - D \qquad \text{Equation 6}$$

In accordance with equation 3, D1 and D2 are desired for calculating the area moments of inertia for layers 1 and 2 with respect to the neutral strain plane, which will be located at C composite.

$$I1' = I1 + D1^2*A1 = (w*h1^3)/12 + D1^2 w*h1 = (h1^3)/12 + h1 D1^2 \qquad \text{Equation 7}$$

$$I2' = I2 + D2^2*A2 = (w*h2^3)/12 + D2^2 w*h2 = (h2^3)/12 + h2 D2^2 \qquad \text{Equation 8}$$

Figure 51:
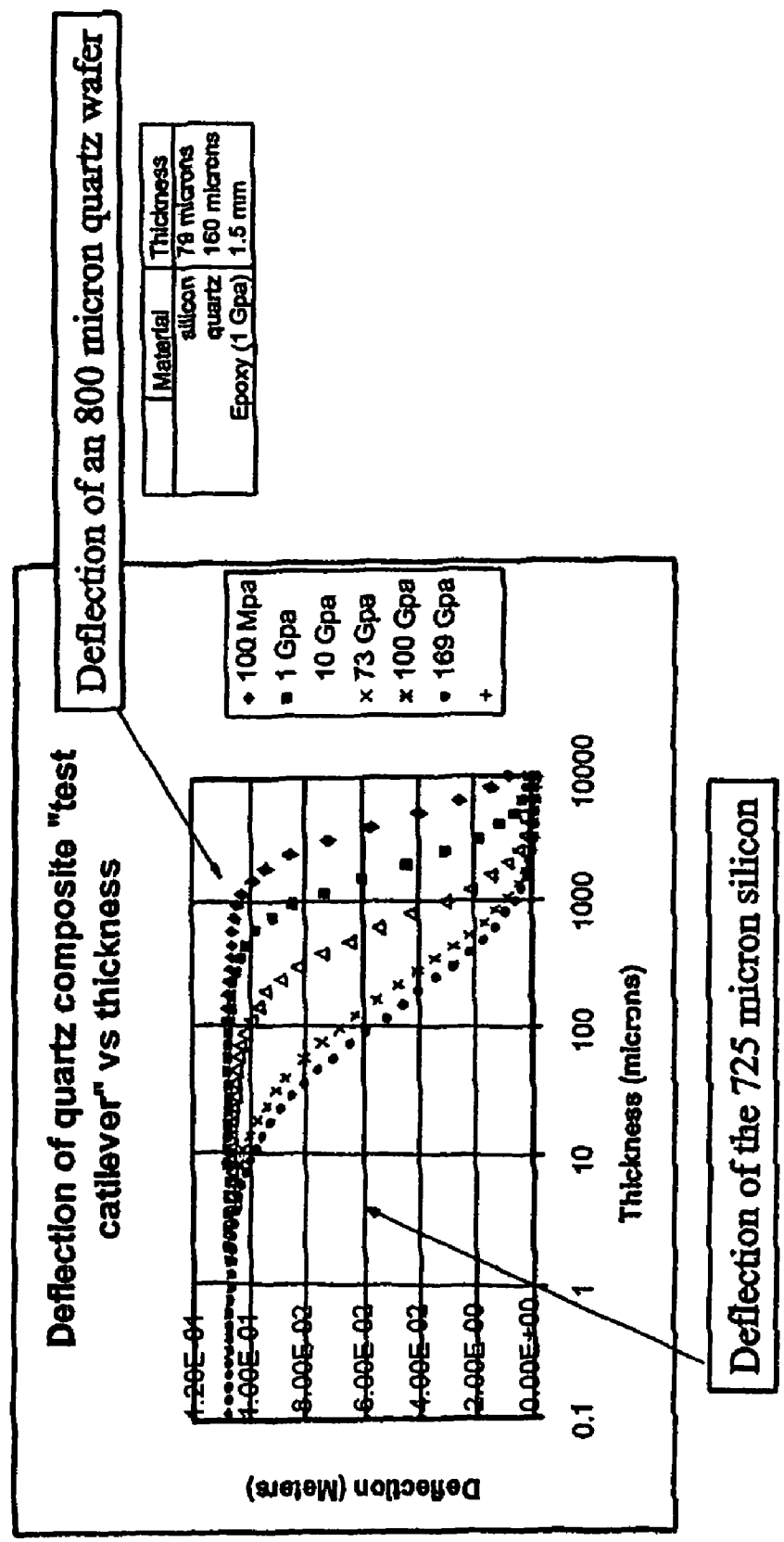

We can use equations 1-8 to calculate the correct thickness of a layer having Young's modulus E added to a 800 micron thick quartz wafer to make its cantilever stiffness equal to that of a silicon wafer bent in the <110> direction. Referring to FIG. 51, we have plotted deflection (meters) against thicknesses of various materials having different Young's modulus, e.g., 100 Mega Pascal, 1 Giga Pascal, etc. As shown is a deflection characteristic of a 800 micron quartz wafer. A deflection characteristic of a 725 micron silicon wafer is also shown. Deflection characteristics of other materials are also shown. Basically such calculations indicate that a 800 micron thick quartz wafer could be stiffened to the level of an 725 micron silicon wafer if a composite with 79 microns of silicon or an addition 160 microns of quartz (total=800+160=960 microns) or about 1.5 mm of a stiff epoxy has been formed. Of course, one of ordinary skill in the art would recognize many variations, modifications, and alternatives.

Figure 52:
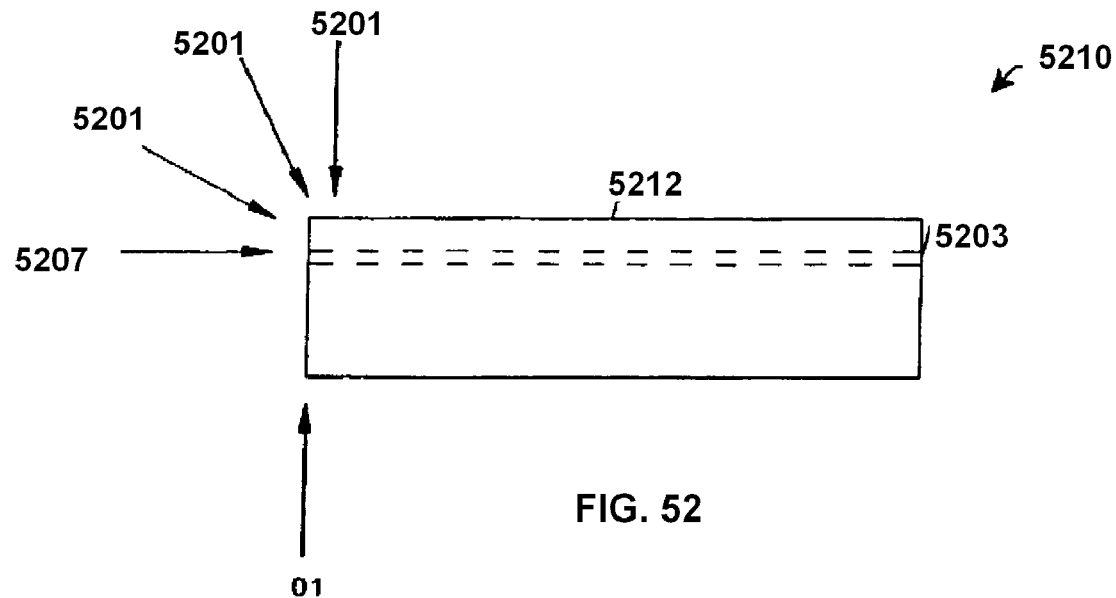
FIGS. 52-55 are simplified diagrams illustrating a controlled cleaving technique according to embodiments of the present invention.

FIG. 52 is a simplified cross-sectional view of an implanted substrate 5210 using selective positioning of cleave energy according to the present invention. This diagram is merely an illustration, and should not limit the scope of the claims herein. The implanted wafer undergoes a step of selective energy placement or positioning or targeting which provides a controlled cleaving action of the material region 5212 at the selected depth. The impulse or impulses are provided using energy sources. Examples of sources include, among others, a chemical source, a mechanical source, an electrical source, and a thermal sink or source. The chemical source can include particles, fluids, gases, or liquids. These sources can also include a chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electromagnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, an electron beam, a thermoelectric heating, a furnace, and the like. The thermal sink can be selected from a fluid jet, a liquid jet, a gas jet, a cryogenic fluid, a super-cooled liquid, a thermoelectric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used depends upon the application.

Figure 53:
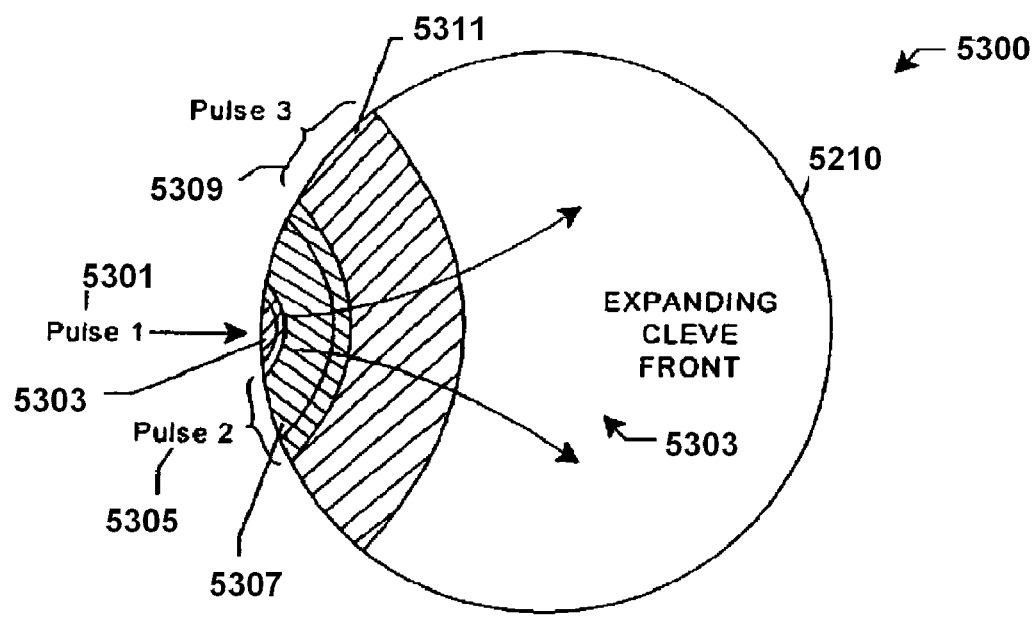

In a specific embodiment, the present invention provides a controlled-propagating cleave. The controlled-propagating cleave uses multiple successive impulses to initiate and perhaps propagate a cleaving process 5300, as illustrated by FIG. 53. This diagram is merely an illustration, and should not limit the scope of the claims herein. As shown, the impulse is directed at an edge of the substrate, which propagates a cleave front toward the center of the substrate to remove the material layer from the substrate. In this embodiment, a source applies multiple pulses (i.e., pulse 1, 2, and 3) successively to the substrate. Pulse 1 5301 is directed to an edge 5303 of the substrate to initiate the cleave action. Pulse 2 5305 is also directed at the edge 5307 on one side of pulse 1 to expand the cleave front. Pulse 3 5309 is directed to an opposite edge 5311 of pulse 1 along the expanding cleave front to further remove the material layer from the substrate. The combination of these impulses or pulses provides a controlled cleaving action 5313 of the material layer from the substrate.

Figure 54:
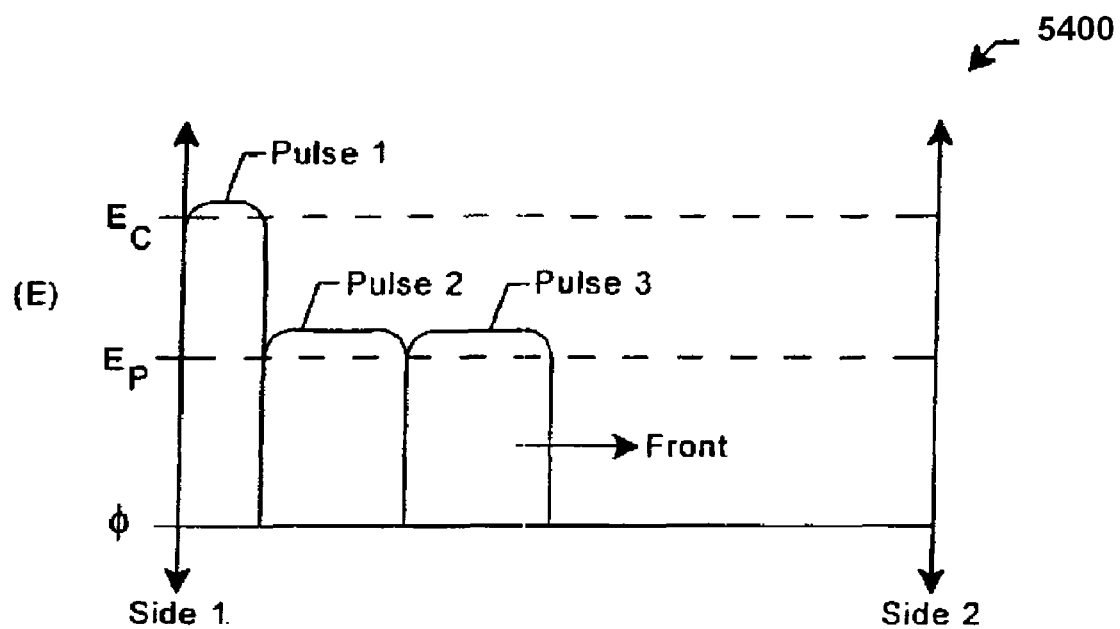

FIG. 54 is a simplified illustration of selected energies 5400 from the pulses in the preceding embodiment for the controlled-propagating cleave. This diagram is merely an illustration, and should not limit the scope of the claims herein. As shown, the pulse 1 has an energy level which exceeds average cleaving energy (E), which is the necessary energy for initiating the cleaving action. Pulses 2 and 3 are made using lower energy levels along the cleave front to maintain or sustain the cleaving action. In a specific embodiment, the pulse is a laser pulse where an impinging beam heats a selected region of the substrate through a pulse and a thermal pulse gradient causes supplemental stresses which together exceed cleave formation or propagation energies, which create a single cleave front. In preferred embodiments, the impinging beam heats and causes a thermal pulse gradient simultaneously, which exceeds cleave energy formation or propagation energies. More preferably, the impinging beam cools and causes a thermal pulse gradient simultaneously, which exceeds cleave energy formation or propagation energies.

Optionally, a built-in energy state of the substrate or stress can be globally raised toward the energy level necessary to initiate the cleaving action, but not enough to initiate the cleaving action before directing the multiple successive impulses to the substrate according to the present invention. The global energy state of the substrate can be raised or lowered using a variety of sources such as chemical, mechanical, thermal (sink or source), or electrical, alone or in combination. The chemical source can include a variety such as particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electromagnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, an electron beam, a thermoelectric heating, and a furnace. The thermal sink can be selected from a fluid jet, a liquid jet, a gas jet, a cryogenic fluid, a super-cooled liquid, a thermoelectric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used also depends upon the application. As noted, the global source increases a level of energy or stress in the material region without initiating a cleaving action in the material region before providing energy to initiate the controlled cleaving action.

In a specific embodiment, an energy source elevates an energy level of the substrate cleave plane above its cleave front propagation energy but is insufficient to cause self-initiation of a cleave front. In particular, a thermal energy source or sink in the form of heat or lack of heat (e.g., cooling source) can be applied globally to the substrate to increase the energy state or stress level of the substrate without initiating a cleave front. Alternatively, the energy source can be electrical, chemical, or mechanical. A directed energy source provides an application of energy to a selected region of the substrate material to initiate a cleave front which self-propagates through the implanted region of the substrate until the thin film of material is removed. A variety of techniques can be used to initiate the cleave action. These techniques are described by way of the FIGS. below.

Figure 55:
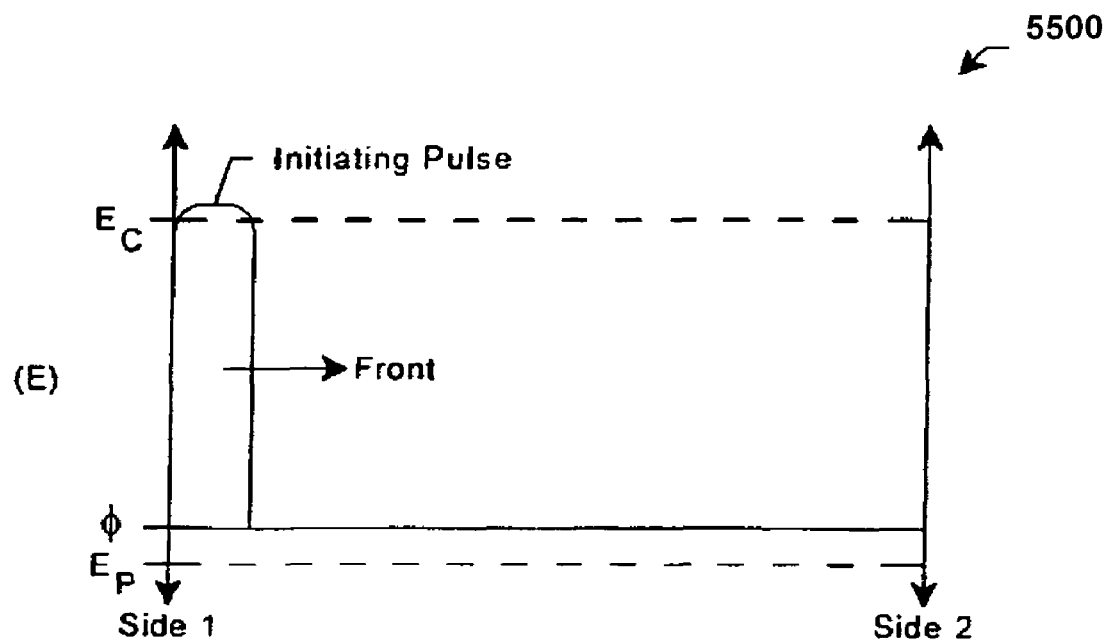

FIG. 55 is a simplified illustration of an energy state 5500 for a controlled cleaving action using a single controlled source according to an aspect of the present invention. This diagram is merely an illustration, and should not limit the scope of the claims herein. In this embodiment, the energy level or state of the substrate is raised using a global energy source above the cleave front propagation energy state, but is lower than the energy state necessary to initiate the cleave front. To initiate the cleave front, an energy source such as a laser directs a beam in the form of a pulse at an edge of the substrate to initiate the cleaving action. Alternatively, the energy source can be a cooling fluid (e.g., liquid, gas) that directs a cooling medium in the form of a pulse at an edge of the substrate to initiate the cleaving action. The global energy source maintains the cleaving action which generally requires a lower energy level than the initiation energy.

While the above is a full description of the specific embodiments, various modifications, alternative constructions and equivalents may be used. Although the above has been described using a selected sequence of steps, any combination of any elements of steps described as well as others may be used. Additionally, certain steps may be combined and/or eliminated depending upon the embodiment. Furthermore, the particles of hydrogen can be replaced using co-implantation of helium and hydrogen ions to allow for formation of the cleave plane with a modified dose and/or cleaving properties according to alternative embodiments. In certain embodiments, the backing substrate can be applied to each of the substrates, including handle and donor. Depending upon the embodiment, the term "quartz" is generally understood in the glass industry. Such quartz term includes at least fused silicon glass, quartz, fused silica, and possibly others according to a specific embodiment. Depending upon the embodiment, certain additives such as impurities, dopants, and other species may be added to the quartz. In alternative embodiments. coatings may also be provided on surfaces or other regions of the quartz material. Therefore, the above description and illustrations should not be taken as limiting the scope of the present invention which is defined by the appended claims.

What is claimed is:

1. A method for manufacturing multi-layered substrates, the method comprising:
providing a handle substrate, the handle substrate having a first deflection characteristic, the handle substrate having a backside and a face;
providing a donor substrate comprising a cleave region, the thickness of material, and a surface region, the cleave region being within the donor substrate to define a thickness of material, the thickness of material being provided between the cleave region and the surface region;
bonding the surface region of the donor substrate to the face of the handle substrate;
coupling a backing substrate to the backside of the handle substrate, the backing substrate being adequate to cause the first deflection characteristic of the handle substrate to be reduced to a predetermined level, the predetermined level being a suitable deflection characteristic for a thickness of material to be transferred onto the face of the handle substrate while the backing substrate remains intact to the handle substrate to maintain at least the suitable deflection characteristic; and
initiating a controlled cleaving process within a portion of the cleave region of the donor substrate to begin removal of the thickness of material from the donor substrate at a portion of the cleave region.

2. The method of claim 1 further comprising removing the backing substrate from the handle substrate to form a resulting multilayered substrate comprising the handle substrate and the thickness of material.

3. The method of claim 1 wherein the handle substrate is selected from quartz or glass.

4. The method of claim 1 wherein the handle substrate comprises a plastic material.

5. The method of claim 1 wherein the handle substrate is selected from a material consisting of a plastic, a polymer, a ceramic, or a composite.

6. The method of claim 1 wherein the handle substrate comprises a metal bearing material.

7. The method of claim 1 wherein the coupling between the backing substrate and the handle substrate is provided using a bonding process.

8. The method of claim 1 wherein the donor substrate comprises a backing member coupled to a backside of the donor substrate, the backing member providing rigidity to the donor substrate.

9. The method of claim 1 wherein the coupling between the backing substrate and the handle substrate is provided using a bonding process, the bonding process being selected from covalent bonding, anodic bonding, chemical bonding, electrostatic bonding, and plasma-activated bonding.

10. The method of claim 1 wherein the handle substrate and the backing substrate comprises a releasable adhesive there between.

11. The method of claim 1 wherein the handle substrate and the backing substrate comprises a temporary adhesive there between.

12. The method of claim 1 wherein the first deflection characteristic causes the thickness of material to be transferred to the handle substrate using the controlled cleaving process with a surface roughness of less than 50 Angstroms.

13. The method of claim 1 wherein the first deflection characteristic causes the thickness of material to be transferred to the handle substrate using the controlled cleaving process with a surface roughness of less than 100 Angstroms.

14. The method of claim 1 wherein the first deflection characteristic causes the thickness of material to be transferred to the handle substrate using the controlled cleaving process with a surface roughness of less than 200 Angstroms.

15. The method of claim 1 wherein the thickness of material is essentially silicon bearing material.

16. The method of claim 1 wherein the thickness of material is selected from Si, SiGe, SiGe alloys, SiC, Group II/VI compounds, and Group III/V compounds.

17. The method of claim 1 further comprising removing the thickness of material entirely from the donor substrate using a propagating cleave front.

18. The method of claim 1 wherein the suitable deflection characteristic is a second deflection characteristic, the second defection characteristic being less than the first deflection characteristic.

19. The method of claim 1 wherein the backing substrate comprises a silicon wafer.

20. The method of claim 1 wherein the backing substrate comprises a quartz wafer.

21. The method of claim 1 wherein the backing substrate is characterized by a third deflection characteristic, the third deflection characteristic being less than the first deflection characteristic.

22. The method of claim 1 wherein the handle substrate is quartz or glass, the quartz or glass having a thickness of about 1 millimeters and less.

23. The method of claim 1 wherein the donor substrate comprises a silicon bearing material, the thickness of material being substantially single crystal silicon.

24. The method of claim 1 wherein the controlled cleaving process provides a propagating cleave front within the portion of the cleave region.

25. The method of claim 1 wherein the backing substrate is permanently maintained on the handle substrate.

26. The method of claim 1 wherein the handle substrate is transparent.

27. The method of claim 1 wherein the donor substrate is secured to an electrostatic chuck during initiation of the controlled cleaving process.

28. The method of claim 1 wherein the donor substrate is secured to a vacuum chuck during initiation of the controlled cleaving process.

29. The method of claim 1 wherein the backing substrate is secured to an electrostatic chuck during initiation of the controlled cleaving process.

30. The method of claim 1 wherein the backing substrate is secured to a vacuum chuck during initiation of the controlled cleaving process.

31. The method of claim 1 further comprising reusing the donor substrate once the controlled cleaving process is complete.

32. The method of claim 31 wherein reusing the donor substrate comprises:
providing a second handle substrate, the second handle substrate having the first deflection characteristic, the second handle substrate having a backside and a face;
providing the donor substrate comprising a second cleave region, the thickness of material, and a second surface region, the second cleave region being within the donor substrate to define the second thickness of material, the second thickness of material being provided between the second cleave region and the second surface region;

bonding the second surface region of the donor substrate to the face of the second handle substrate;

coupling a second backing substrate to the backside of the second handle substrate, the second backing substrate being adequate to cause the first deflection characteristic of the second handle substrate to be reduced to a predetermined level, the predetermined level being a suitable deflection characteristic for a thickness of material to be transferred onto the face of the second handle substrate while the backing substrate remains intact to the second handle substrate to maintain at least the suitable deflection characteristic; and initiating the controlled cleaving process within a portion of the second cleave region of the donor substrate to begin removal of the second thickness of material from the donor substrate at a portion of the second cleave region.

33. The method of claim 1 further the cleave region is formed by implantation of particles into the surface region of the donor substrate.

34. The method of claim 33 wherein the particles are implanted as ions.

35. The method of claim 34 wherein the implantation is performed utilizing a technique selected from ion implantation, plasma immersion ion implantation (PIII), and ion shower.

36. The method of claim 34 wherein ions of a rare gas are implanted.

37. The method of claim 34 wherein ions of hydrogen are implanted.

38. The method of claim 37 wherein the hydrogen ions are implanted at an energy of between about 1 KeV to about 1 MeV.

39. The method of claim 37 wherein the hydrogen ions are implanted with a dose of between about $1 \times 10^{15}$ and $1 \times 10^{18}$ atoms/cm$^2$.

40. The method of claim 1 wherein the temperature is maintained at below 200° C. to allow the backing substrate to be easily removed from the handle substrate.

41. The method of claim 40 wherein the handle substrate and the donor substrate have substantially different thermal expansion coefficients.

42. The method of claim 40 wherein energy or stress is limited to a value below a cleave initiation energy.

43. The method of claim 1 wherein the controlled cleaving process is initiated by providing an impulse using an energy source.

44. The method of claim 43 wherein the impulse is provided from a thermal source or sink.

45. The method of claim 44 wherein the thermal source or sink is selected from radiation, convection, or conduction.

46. The method of claim 44 wherein the thermal source is selected from a photon beam, a fluid jet, a liquid jet, an electromagnetic field, an electron beam, a thermoelectric heating, or a furnace.

47. The method of claim 44 wherein the thermal sink is selected from a fluid jet, a liquid jet, a gas jet, a cryogenic fluid, a super-cooled liquid, a thermo-electric cooling means, or an electro/magnetic field.

48. The method of claim 44 wherein the thermal source or sink is applied as flood, time-varying, spatially varying, or continuous.

49. The method of claim 1 further comprising:
propagating the controlled cleaving process to complete removal of the thickness of material from the donor substrate at a portion of the cleave region.

50. The method of claim 49 wherein the controlled cleaving is propagated by providing an impulse using an energy source.

51. The method of claim 50 wherein the impulse is provided from a thermal source or sink.

52. The method of claim 51 wherein the thermal source or sink is selected from radiation, convection, or conduction.

53. The method of claim 51 wherein the thermal source is selected from a photon beam, a fluid jet, a liquid jet, an electromagnetic field, an electron beam, a thermoelectric heating, or a furnace.

54. The method of claim 51 wherein the thermal sink is selected from a fluid jet, a liquid jet, a gas jet, a cryogenic fluid, a super-cooled liquid, a thermo-electric cooling means, or an electro/magnetic field.

55. The method of claim 51 wherein the thermal source or sink is applied as flood, time-varying, spatially varying, or continuous.

56. The method of claim 49 wherein:
the controlled cleaving process comprises raising a global energy state of the donor substrate to above a cleave front propagation energy state, and below an energy state necessary to initiate a cleave front; and
initiating the controlled cleaving process comprises directing an energy pulse at an edge of the donor substrate.

57. The method of claim 56 wherein the energy pulse is provided from a thermal source or sink.

58. The method of claim 57 wherein the thermal source or sink is selected from radiation, convection, or conduction.

59. The method of claim 57 wherein the thermal source is selected from a photon beam, a fluid jet, a liquid jet, an electromagnetic field, an electron beam, a thermoelectric heating, or a furnace.

60. The method of claim 59 wherein the thermal source comprises a laser beam.

61. The method of claim 57 wherein the thermal sink comprises a cooling fluid.

* * * * *